(12) United States Patent
Yamakaji

(10) Patent No.: US 11,946,953 B2
(45) Date of Patent: Apr. 2, 2024

(54) ELECTROMAGNETIC FIELD SENSOR

(71) Applicant: Mitsubishi Electric Corporation, Tokyo (JP)

(72) Inventor: Yusuke Yamakaji, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/917,569

(22) PCT Filed: May 11, 2020

(86) PCT No.: PCT/JP2020/018816
§ 371 (c)(1),
(2) Date: Oct. 7, 2022

(87) PCT Pub. No.: WO2021/229638
PCT Pub. Date: Nov. 18, 2021

(65) Prior Publication Data
US 2023/0127382 A1 Apr. 27, 2023

(51) Int. Cl.
*G01R 15/20* (2006.01)
*G01R 19/00* (2006.01)

(52) U.S. Cl.
CPC ......... *G01R 15/20* (2013.01); *G01R 19/0092* (2013.01)

(58) Field of Classification Search
CPC ...... G01R 15/20; G01R 15/207; G01R 19/00; G01R 19/0092; G01R 29/08; G01R 29/12; G01R 29/10; G01R 29/0871; G01R 29/0878; G01R 33/20; G01R 33/208; H04B 5/00; H04B 5/0081
See application file for complete search history.

(56) References Cited

U.S. PATENT DOCUMENTS

| 8,013,600 B1 * | 9/2011 | Yepez, III | G01N 27/9006 324/240 |
| 2007/0177414 A1 | 8/2007 | Funato et al. | |
| 2013/0229318 A1 * | 9/2013 | Ng | H01Q 5/30 343/770 |

(Continued)

FOREIGN PATENT DOCUMENTS

| CN | 101065682 A | 10/2007 |
| CN | 111224724 A * | 6/2020 |

(Continued)

OTHER PUBLICATIONS

International Search Report and Written Opinion dated Aug. 4, 2020, received for PCT Application PCT/JP2020/018816, filed on May 11, 2020, 10 pages including English Translation.

(Continued)

*Primary Examiner* — Son T Le
(74) *Attorney, Agent, or Firm* — XSENSUS LLP

(57) ABSTRACT

An electromagnetic field sensor includes a conductor plate, a signal output terminal to output a potential difference between the conductor plate and the signal output terminal, and a linear conductor including a first end electrically connected to a plate face of the conductor plate and a second end opposite to the first end and provided with a signal output terminal. The electromagnetic field sensor includes a loop plane that is formed by the conductor plate and the linear conductor and orthogonal to a plate face of the conductor plate when viewed from the side.

17 Claims, 25 Drawing Sheets

(56) References Cited

U.S. PATENT DOCUMENTS

| | | | |
|---|---|---|---|
| 2017/0104515 A1* | 4/2017 | Holweg | ................ H04B 5/0081 |
| 2018/0052065 A1* | 2/2018 | Sipilä | ........................ H05K 1/18 |
| 2019/0113555 A1 | 4/2019 | Kobayashi et al. | |
| 2019/0361062 A1 | 11/2019 | Yamakaji et al. | |

FOREIGN PATENT DOCUMENTS

| | | | | |
|---|---|---|---|---|
| JP | 10-104295 A | 4/1998 | | |
| JP | 11-295402 A | 10/1999 | | |
| JP | 11-326418 A | 11/1999 | | |
| JP | 2007-187539 A | 7/2007 | | |
| JP | 2009-229101 A | 10/2009 | | |
| JP | 2010-145194 A | 7/2010 | | |
| JP | 2011-24168 A | 2/2011 | | |
| JP | 2017-49010 A | 3/2017 | | |
| JP | 6257864 B1 | 1/2018 | | |
| JP | 2020-34285 A | 3/2020 | | |
| WO | WO-0145199 A1 * | 6/2001 | ............. | H01Q 1/244 |
| WO | 2017/212542 A1 | 12/2017 | | |
| WO | 2018/179045 A1 | 10/2018 | | |
| WO | WO-2020230819 A1 * | 11/2020 | ........... | H01Q 21/065 |

OTHER PUBLICATIONS

Notice of Reasons for Refusal dated Dec. 15, 2020, received for JP Application 2020-555250, 8 pages including English Translation.

Decision to Grant dated Apr. 20, 2021, received for JP Application 2020-555250, 5 pages including English Translation.

Extended European search report dated Mar. 23, 2023, in corresponding European patent Application No. 20935749.0, 7 pages.

Office Action dated Apr. 28, 2023, in corresponding Chinese patent Application No. 202080100535.X, 15 pages.

Chinese Office Action dated Mar. 9, 2023 in corresponding Chinese Patent Application No. 202080100535.X (with machine-generated English translation), 12 pages.

European Office Action dated Oct. 24, 2023, in corresponding European Patent Application No. 20935749.0, 6pp.

* cited by examiner

ELECTROMAGNETIC FIELD SENSOR

CROSS-REFERENCE TO RELATED APPLICATION

The present application is based on PCT filing PCT/JP2020/018816, filed May 11, 2020, the entire contents of which is incorporated herein by reference.

TECHNICAL FIELD

The present disclosure relates to an electromagnetic field sensor.

BACKGROUND ART

As an electromagnetic field sensor used for measuring radio waves or electromagnetic noise, for example, there is an electric field sensor described in Patent Literature 1. This electric field sensor measures the intensity of electromagnetic waves radiated from a device under test (DUT) using a sheet-like antenna that is deformed in accordance with the surface shape of the device under test.

CITATION LIST

Patent Literatures

Patent Literature 1: JP 10-104295 A

SUMMARY OF INVENTION

Technical Problem

The electric field sensor described in Patent Literature 1 detects a potential difference between a sheet-like antenna (synonymous with a sensor or a probe) and a reference potential (a ground potential). However, if the sheet-like antenna is deformed in accordance with the surface shape of a device under test (DUT) and it changes the distance between the sheet-like antenna and the device under test, the potential difference generated between the sheet-like antenna and the ground potential changes accordingly, so that there is a problem that the signal of the device under test in a wide band cannot be correctly measured.

Furthermore, the electric field antenna has high sensitivity only in a case where the signal of the device under test resonates due to the size of an antenna element. For this reason, the electric field antenna described in Patent Literature 1 has a problem that an alternating current that is weak in a wide band like electromagnetic noise cannot be detected.

For example, in a case where the speed of light is c (m/s) and the wavelength is λ(m) for various frequencies f (Hz), if the antenna element has a dimension of n times the wavelength at λ calculated by λ=c/f, resonance occurs in the signal of the device under test, and reception sensitivity can be improved. At this time, in a case where a printed circuit board whose relative permittivity $\varepsilon_r$ is not 1 or a magnetic body whose relative permeability $\mu_r$ is not 1 is used, wavelength shortening occurs, and λ becomes $\lambda/\sqrt{(\varepsilon_r \times \mu_r)}$. Since $\varepsilon_r$ and $\mu_r$ have values equal to or larger than 1 except for special materials such as metamaterials or special structures, the wavelength λ is usually shortened.

The present disclosure solves the above problem, and an object thereof is to obtain an electromagnetic field sensor capable of improving the detection sensitivity of an alternating current in a wide band.

Solution to Problem

An electromagnetic field sensor according to the present disclosure includes a conductor plate and a linear conductor including a first end connected to a first face of the conductor plate without an electrical circuit component, and a second end provided with a signal output terminal, the linear conductor connecting the conductor plate and the signal output terminal, wherein the electromagnetic field sensor includes a loop plane that is formed by the conductor plate and the linear conductor and composed of only a plane orthogonal to the conductor plate when viewed from a side.

Advantageous Effects of Invention

According to the present disclosure, the electromagnetic field sensor includes a conductor plate and a linear conductor including a first end electrically connected to a first face of the conductor plate and a second end at which a signal output terminal is provided, wherein the electromagnetic field sensor includes a loop plane that is formed by the conductor plate and the linear conductor and orthogonal to the conductor plate when viewed from side. The magnetic flux generated around a device under test (DUT) penetrates the loop plane and thus an induced electromotive force is generated in the loop plane, and the alternating current generated in the device under test by the induced electromotive force is measured with high sensitivity without using a resonance phenomenon. Therefore, the electromagnetic field sensor according to the present disclosure can improve the detection sensitivity of the alternating current in a wide band.

DESCRIPTION OF EMBODIMENTS

First Embodiment

Figure 1A:
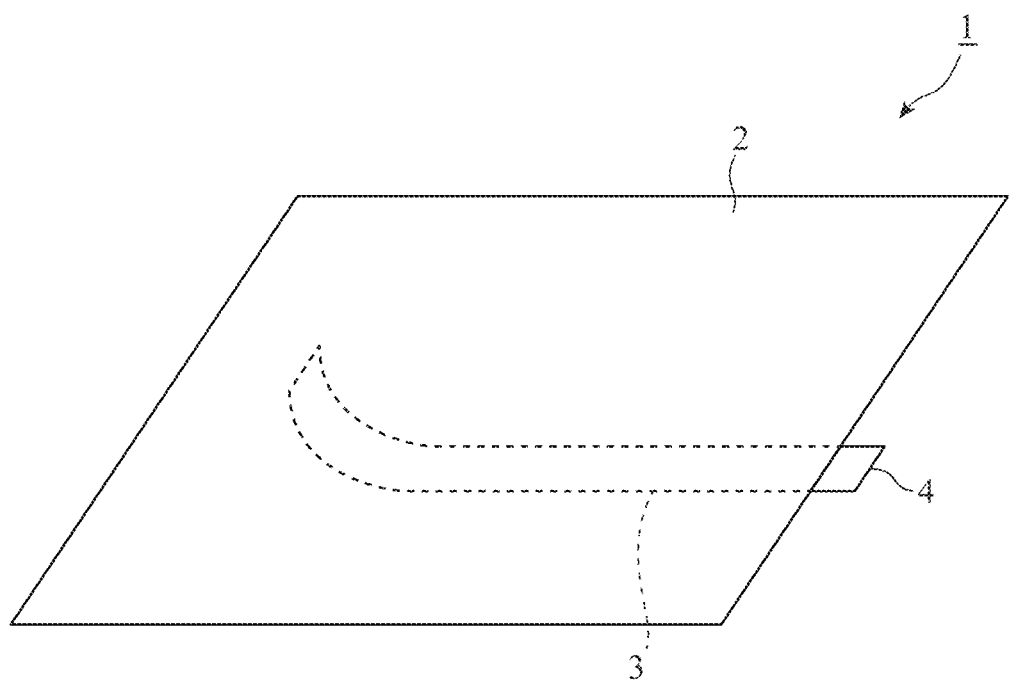
FIG. 1A is a perspective view illustrating an electromagnetic field sensor according to a first embodiment.
Figure 1B:
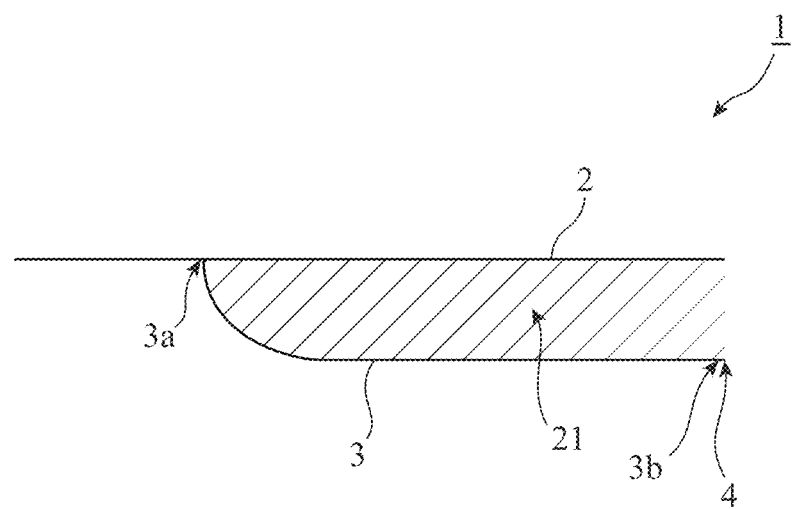
FIG. 1B is a side view illustrating the electromagnetic field sensor according to the first embodiment.

FIG. 1A is a perspective view illustrating an electromagnetic field sensor 1 according to a first embodiment, and FIG. 1B is a side view illustrating the electromagnetic field sensor 1. The electromagnetic field sensor 1 is, for example, a sensor that detects an alternating current flowing through a cable, and includes a conductor plate 2 and a linear conductor 3 as illustrated in FIGS. 1A and 1B. The conductor plate 2 is made of a conductive material, and is a single plate without any hole unless otherwise described. The thickness of the conductor plate 2 is, for example, about 10 (μm) to 3 (mm).

One end 3a of the linear conductor 3 in a linear longitudinal direction is connected to one face of the conductor plate 2. Only the end 3a of the linear conductor 3 is connected to the conductor plate 2, and the other portions are not electrically connected. A signal output terminal 4 is provided at an end 3b of the linear conductor 3 opposite to the end 3a. The linear conductor 3 may have a conductor exposed, may be a covered wire, or may be covered with an insulating film.

As illustrated in FIG. 1B, the conductor plate 2 and the linear conductor 3 form a loop plane 21 that is a plane surrounded by the shortest path starting from the end 3b that is the open end of the linear conductor 3 and returning to the side of the end 3b of the linear conductor 3 via the linear conductor 3 and the conductor plate 2, when viewed from the side. The loop plane 21 is orthogonal to the plate face of the conductor plate 2, when viewed from the side. In the electromagnetic field sensor 1, the potential difference between the conductor plate 2 and the signal output terminal 4 is measured, and the alternating current, which is a device under test (DUT), is calculated on the basis of the measured potential difference.

The electromagnetic field sensor 1 desirably has a constant (for example, ±10%) output regardless of individual differences. For example, the electromagnetic field sensor 1 includes a printed circuit board or a thin film with a small tolerance. Furthermore, the electromagnetic field sensor 1 may be formed in, for example, a printed circuit board on which another integrated circuit is mounted or inside a chip of an integrated circuit (IC). With this structure, it is possible to transmit and receive a signal and power by injecting or detecting the signal and power into or from the electromagnetic field sensor, and thus, this can be used for communication with or power transmission to a circuit facing the electromagnetic field sensor or a peripheral circuit. As a result, communication and power transmission between ICs on the printed circuit board without wires being interposed can be implemented without making an influence on the IC itself by the use of the conductor plate in the first embodiment. Since the electromagnetic field sensor 1 with a small individual difference is configured, by measuring a common device under test (DUT) using a plurality of different electromagnetic field sensors 1, variations in output characteristics of the electromagnetic field sensors are suppressed.

Figure 2:
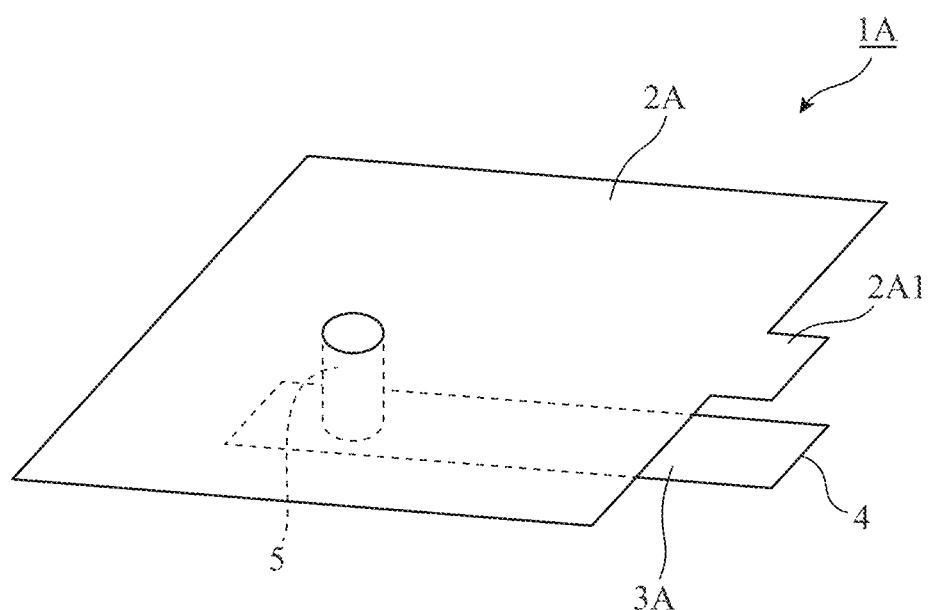
FIG. 2 is a perspective view illustrating a modification of the electromagnetic field sensor according to the first embodiment.

FIG. 2 is a perspective view illustrating an electromagnetic field sensor 1A, which is a modification of the electromagnetic field sensor 1. In FIG. 2, the electromagnetic field sensor 1A includes a conductor plate 2A, a linear conductor 3A, and a via 5. At least the longitudinal direction of the linear conductor 3A is disposed in parallel with the conductor plate 2A. The via 5 is a first columnar conductor that electrically connects the conductor plate 2A and an end of the linear conductor 3A. The conductor plate 2A and the linear conductor 3A form the loop plane 21 surrounded by the shortest path starting from one open end of the linear conductor 3A and returning to the side of the one end of the linear conductor 3A via the linear conductor 3A, the via 5, and the conductor plate 2A, when viewed from the side.

The electromagnetic field sensor according to the first embodiment is characterized in that the loop plane 21 is orthogonal to the plate face of the conductor plate 2A. Note that, in the electromagnetic field sensor 1A, the via 5 is not necessarily provided at an end of the linear conductor 3A. For example, when the length of the linear conductor 3A is divided in half, it is only required that the via 5 is provided in one portion, and the signal output terminal 4 is provided in the other portion.

Figure 3:
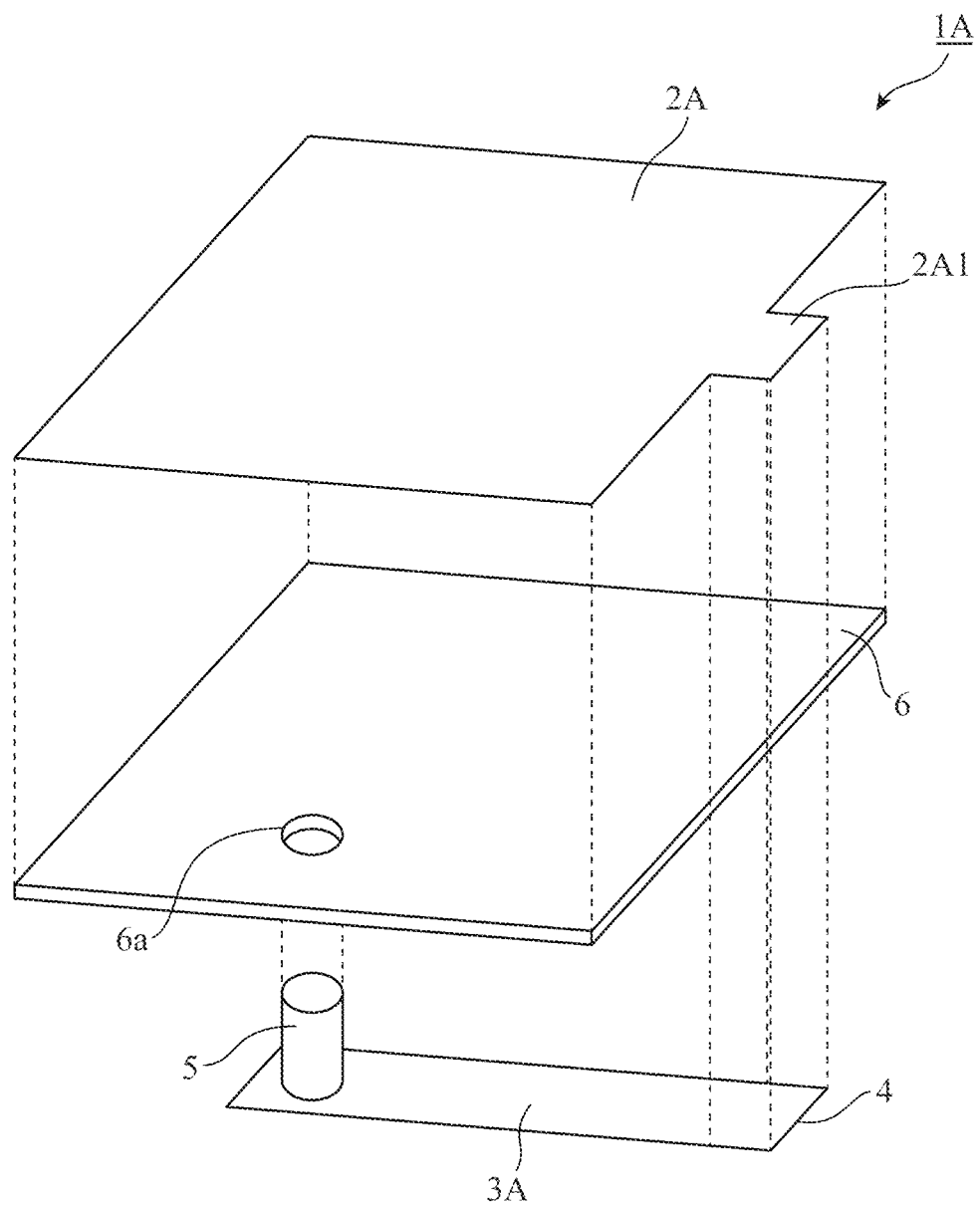
FIG. 3 is an exploded perspective view illustrating a configuration of the electromagnetic field sensor in FIG. 2.
Figure 4:
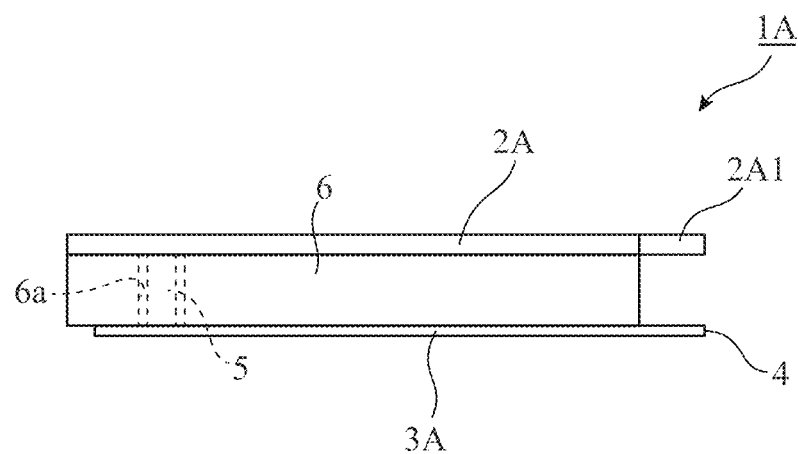
FIG. 4 is a side view illustrating the electromagnetic field sensor in FIG. 2.

FIG. 3 is an exploded perspective view illustrating a configuration of the electromagnetic field sensor 1A, and illustrates the electromagnetic field sensor 1A in which a dielectric 6 is provided between the conductor plate 2A and the linear conductor 3A. FIG. 4 is a side view illustrating the electromagnetic field sensor 1A in FIG. 3. The dielectric 6 also includes an air layer or a vacuum layer. That is, as long as the linear conductor 3A has a robust structure, the dielectric 6 does not necessarily have a physical structure. Note that examples of the material of the dielectric 6 with a physical structure include a resin such as glass epoxy or paper phenol, and a polymer material such as polyimide. Furthermore, in a case where the device under test is not a coil that intentionally generates a magnetic field, a magnetic body represented by ferrite can be used instead of the dielectric. In the case of ferrite with high insulation performance, the ferrite is used instead of the dielectric, but a ferrite with not high insulation performance may be used in combination with the dielectric. As a result, the magnetic field of the device under test gathers in the magnetic body, and thus the amount of magnetic flux penetrating the loop plane 21 can be increased. As a result, the voltage generated at the signal output terminal can be increased. That is, the reception sensitivity of the electromagnetic field sensor can be increased.

As illustrated in FIGS. 3 and 4, the dielectric 6 with a physical structure includes a through-hole 6a. The through-hole 6a is a first through-hole that forms a clearance through which the via 5 passes. The conductor plate 2A and the linear conductor 3A are electrically connected by the via 5 passing through the through-hole 6a in the dielectric 6. Note that, in a case where the dielectric 6 is an air layer or a vacuum layer, the through-hole 6a is unnecessary. Further, the via 5 may be provided in singular or plural.

A projection 2A1 is formed on a side of the conductor plate 2A, which is illustrated in FIGS. 3 and 4, on the side of the signal output terminal 4. The potential difference between the conductor plate 2A and the signal output terminal 4 can be easily measured by attaching a connector or soldering a signal line to the projection 2A1.

The conductor plate 2A is made of an inorganic material such as aluminum, copper, iron, or an alloy of a plurality of metals. Alternatively, the conductor plate 2A may be made of a conductive organic material. Since the conductor plate 2A desirably has a higher conductivity, copper or aluminum is suitable. In addition, the face of the conductor plate 2A may be covered with an insulator film for the purpose of preventing oxidation and preventing a short circuit with the device under test.

No through-hole is formed in the conductor plate 2A according to the first embodiment, and the conductor plate 2A is a single plate-like member. Note that, for example, in a case where the end of the linear conductor 3A is connected by a bolt and a nut, a through-hole for passing the bolt is formed in the conductor plate 2A. The wiring width of the linear conductor 3A depends on the dimension of a device under test (DUT), the frequency band to be measured, and the current flowing through the linear conductor. For example, the wiring width of the linear conductor 3A is about 0.1 (mm) to 10 (mm), and is desirably about 1 (mm) if only a current equal to or less than 1 A flows. Note that the width may be equal to or less than 0.1 mm in a case where fine processing is easily performed, for example, in a case of disposing the linear conductor inside a semiconductor. The current I (A) flowing through the linear conductor is a value calculated by I=V/R from a reception voltage V (V) and a resistance value R ($\Omega$) (usually 50 ($\Omega$)) of a measurement device attached to both reception ends.

In the electromagnetic field sensor 1A including a printed circuit board, for example, the conductor plate 2A is a solid pattern of a conductor formed on one main face of the printed circuit board, and the linear conductor 3A is a conductor line formed on the other main face of the printed circuit board. The linear conductor 3A has a rectangular cross-section. In a case where the linear conductor 3A is a single wire or a covered strand wire, the cross-section of the linear conductor 3A is elliptical.

Figure 5:
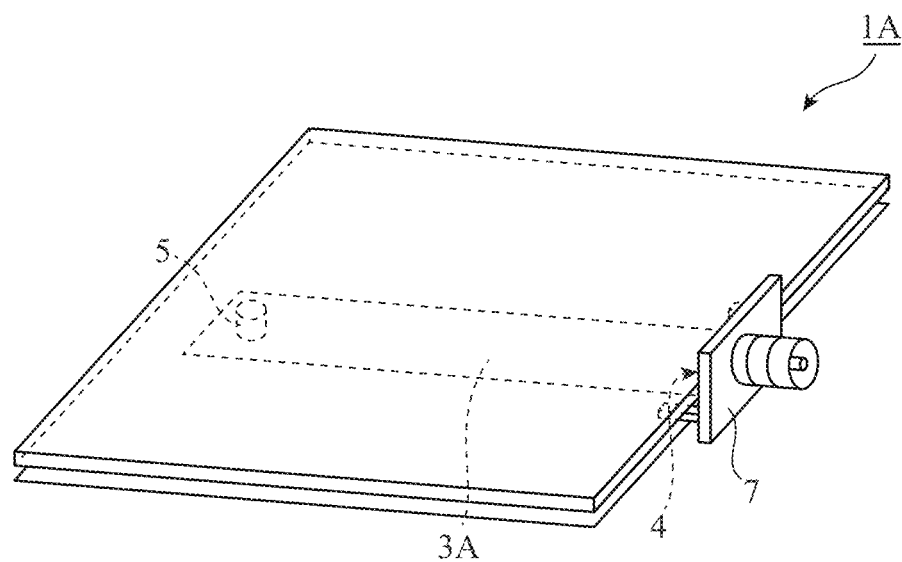
FIG. 5 is a perspective view illustrating the electromagnetic field sensor of FIG. 2 to which a connector is attached.

FIG. 5 is a perspective view illustrating the electromagnetic field sensor 1A to which a connector 7 is attached, and illustrates the electromagnetic field sensor 1A including a printed circuit board. The connector 7 is a coaxial connector, and the coaxial connector includes series such as SMA, SMB, or BNC. Note that the connector 7 does not need to be a coaxial connector, and a fastening terminal or a soldered covered wire may be used.

The electromagnetic field sensor 1 or 1A and the measurement device can be connected by various structures. Note that in a case where a signal with a frequency equal to or higher than 10 (MHz) or more is measured, it is desirable to use a coaxial cable for connection between the electromagnetic field sensor 1 or 1A and the measurement device. In the case of using a covered wire for connection between the electromagnetic field sensor 1 or 1A and the measurement device, it is desirable to use a twisted pair cable. In addition, it is desirable that the cable connecting the electromagnetic field sensor 1 or 1A and the measurement device is as short as possible.

The measurement device is, for example, an oscilloscope, a spectrum analyzer, or a real-time spectrum analyzer, and measures a potential difference between the conductor plate 2 and the signal output terminal 4. Note that any measurement device may be used as long as the measurement device can detect a target AC signal.

Furthermore, an amplifier for amplifying a signal, a filter for extracting only a specific frequency such as a band-pass filter, a band-reject filter, a low-pass filter or a high-pass filter, and an attenuator for attenuating a signal may be provided between the connector 7 and the measurement device. Further, the ferrite core may be attached to a cable in the immediate vicinity of the connector in order to prevent a case where the coaxial cable or the twisted pair cable serves as a sensor and detects a signal generated by the device under test. This ferrite core attenuates a common mode signal, but does not attenuate a normal mode signal, which is the output of the electromagnetic field sensor according to the first embodiment, and thus does not make an influence on the measurement result. Note that, although the common mode signal itself does not make an influence on the measurement signal of the measurement device, conversion (an Sdc21 component in the case of being expressed by a mixed mode S parameter among S parameters) from the common mode signal to the normal mode signal that generally makes an influence on the measurement result is likely to occur at parts changing in structure, such as the connection portion between the cable and the connector. As a result, a signal of a component other than the reception signal of the electromagnetic field sensor is received. The ferrite core has an effect of removing this component.

The device under test whose alternating current is measured using the electromagnetic field sensor 1 or 1A is desirably, for example, a cable through which a current flows in one direction. The device under test desirably generates a magnetic flux in one direction, and may be, for example, a microstrip line, a printed circuit board on which a circuit component is mounted, or an antenna with any shape (in a broad sense, all the conductors to which an AC voltage is applied are antennas) in addition to a cable. The device under test may be noise (current) flowing through a substrate configured by combining microstrip lines or a wire harness inside an IC component.

The electromagnetic field sensor 1 or 1A has high detection sensitivity (directivity) with respect to the direction of the current flowing through the device under test. For example, the direction of the current flowing through the device under test can be grasped by measuring the current while changing the angle of the electromagnetic field sensor 1 or 1A with respect to the device under test. Hereinafter, for simplicity of description, it is assumed that the device under test to be measured by using the electromagnetic field sensor 1 or 1A is an AC signal flowing through a cable.

When an alternating current flows through the cable, a magnetic flux is generated around the cable in accordance with the Biot-Savart law. When the loop plane surrounded by the path of a conductor with opened both ends is disposed in the direction in which the magnetic flux penetrates, an induced electromotive force is generated in the path of the conductor in accordance with the Lenz's law. The current generated by the induced electromotive force can be detected as a magnetic flux around the cable by applying the voltage at both ends of the path of the conductor to a resistor and measuring the voltage generated at both ends of the resistor using a measurement device. That is, the magnetic flux around the cable is detected as an alternating current flowing through the cable.

The electromagnetic field sensor 1 or 1A is used in proximity to the cable, which is a device under test (DUT), and is disposed, for example, at an interval of about 0.1 (mm) to 30 (cm) from the cable. The interval is desirably the minimum distance among distances at which the insulation breakdown voltage can be maintained between the electromagnetic field sensor 1 or 1A and the cable. The insulation breakdown voltage of air is about 1 (kV/mm). For example, in a case where a cable through which 15 (A) flows at 200 (V) is a device under test (DUT), the electromagnetic field sensor 1 or 1A is attached to a coating (vinyl) of the cable, or is desirably disposed at a distance equal to or less than 1 (mm) from the cable. As the distance between the electromagnetic field sensor 1 or 1A and the cable is shorter, the S/N ratio can be improved, and thus the measurement sensitivity of the alternating current by the measurement device is improved.

The measurement frequency of an AC signal is mainly determined by the dimensions of the electromagnetic field sensor, that is, the area of the loop plane 21 and the level of a noise floor measured by the measurement device, and is, for example, a band of about 100 (kHz) to 2 (GHz). The measurement device such as a spectrum analyzer with a low noise floor or an oscilloscope with a large quantization bit rate (for example, 16 (bits)) can measure an AC signal in a frequency band lower than 10 (kHz). Note that the dynamic range of the 16 bit oscilloscope is $20 \times \log_{10}(2^{16}) \approx 96$ (dB).

In addition, in an environment in which disturbance noise is small such as an anechoic chamber or a shield room, or in a case where the amplitude of the noise source itself is larger than that of the disturbance noise, the measurement device can measure a magnetic flux in a wider frequency band from 1 (kHz) to 3 (GHz) using the electromagnetic field sensor 1 or 1A.

As the dimension of the electromagnetic field sensor 1 or 1A decreases, the detection sensitivity of the magnetic flux around the cable decreases accordingly, but resonance depending on the length does not occur, and thus an AC signal in a higher frequency band can be measured. As described above, the electromagnetic field sensor has a suitable size depending on the device under test, but theoretically, can detect AC signals in all frequency bands.

In particular, the length of the linear conductor 3 or 3A is desirably equal to or less than $c/(8 \times fmax \times \sqrt{\varepsilon_r})$ or less, wherein "fmax (Hz)" is an upper limit value of a measurement frequency, "c (m/s)" is a light speed, and "$\varepsilon_r$" is a relative permittivity of the dielectric. Furthermore, in the case of using a member with a relative permeability $\mu_r$ larger than 1, for example, a ferrite substrate, the value of the relative permittivity $\varepsilon_r$ is replaced with $\varepsilon_r \times \mu_r$. By using the electromagnetic field sensor including the linear conductor of this length, it is possible to measure an AC signal in a band equal to or lower than the resonance frequency at which the detection sensitivity decreases. In the case of measuring the AC signal in a band equal to or lower than the resonance frequency, a potential distribution may be generated in the conductor plate 2. In this case, if the conductor plate 2 has a magnitude of about one tenth wavelength with respect to the wavelength of the frequency of the magnetic field around the cable, the generation of the potential distribution is avoided.

In a case where the length of the linear conductor 3 or 3A is equal to or larger than $c/(fmax \times \sqrt{\varepsilon_r})$, the measurement can be performed at a frequency higher than the resonance frequency using the electromagnetic field sensor 1 or 1A, wherein "fmax (Hz)" is an upper limit value of a measurement frequency, "c (m/s)" is a light speed, and "$\varepsilon_r$" is a relative permittivity of the dielectric. As a result, the measurement device can perform measurement without lowering the detection sensitivity. Note that if the length of the linear conductor 3 or 3A is equal to or larger than $c/(fmax \times \sqrt{\varepsilon_r})$, a frequency band in which resonance occurs periodically is generated. Therefore, it is desirable to avoid the measurement of the AC signal with the resonance frequency using the electromagnetic field sensor 1 or 1A or to shorten the length of the linear conductor 3 or 3A.

In the electromagnetic field sensor 1 or 1A, a magnetic flux is applied to the conductor plate 2 or 2A, so that an eddy current is generated. The magnetic flux generated in the cable changes to the magnetic flux along the conductor plate 2 or 2A, so that the magnetic flux passing through the linear conductor 3 or 3A increases. This is described using the electric image method, as described below. Since the electromagnetic field sensor 1 or 1A can increase the density of the magnetic flux passing through the loop plane 21, the detection sensitivity is high.

In the electromagnetic field sensor 1 or 1A, the total number of lines of electric force generated from the device under test is different between the conductor plate 2 or 2A and the linear conductor 3 or 3A. The conductor plate 2 or 2A is close to the linear conductor 3 or 3A. For this reason, many lines of electric force are applied to the conductor plate 2 or 2A with a large area. As a result, the potential difference between the conductor plate 2 or 2A and the linear conductor 3 or 3A increases. Note that in a case where the device under test is a cable that hardly generates a potential, a line of electric force between the cable and the electromagnetic field sensor is less likely to be generated.

Figure 6:
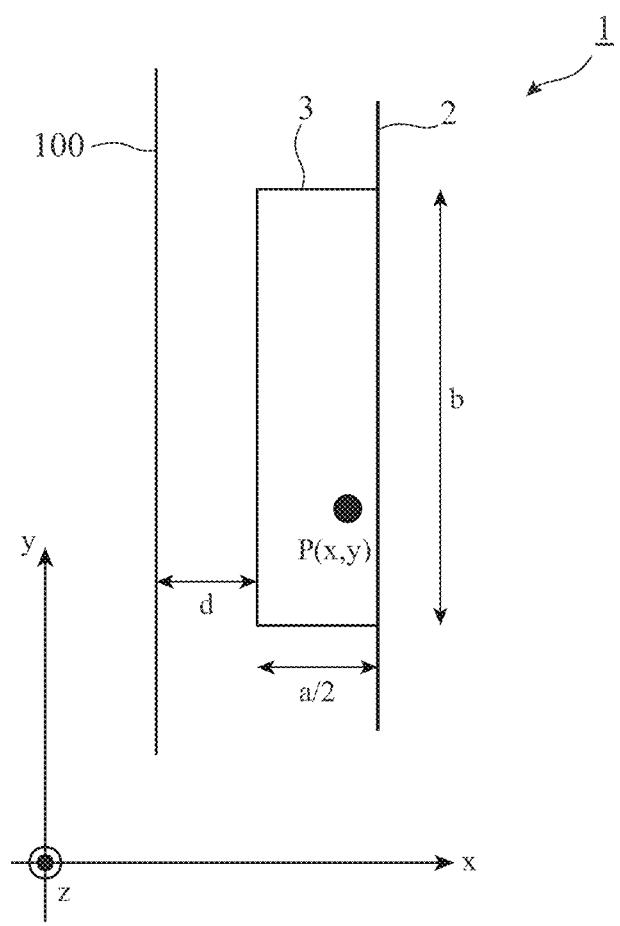
FIG. 6 is an explanatory diagram illustrating a positional relationship between the electromagnetic field sensor according to the first embodiment and a cable.

FIG. 6 is an explanatory diagram illustrating a positional relationship between the electromagnetic field sensor 1 and a cable 100, and schematically illustrates a state of the electromagnetic field sensor 1 and the cable 100 when viewed from the side. In FIG. 6, the cable 100, which is a device under test (DUT), is a cable with a cross-sectional area of zero. A magnetic field H formed in the cable 100 can be calculated in accordance with the following equation (1). In the following equation (1), I (A) is a current flowing through the cable 100. In FIG. 6, d (m) is the nearest distance between the linear conductor 3 and the cable 100. P (x, y) is a position coordinate in the loop plane 21. The dielectric 6 is assumed to be a vacuum layer.

$$H = \frac{I}{2\pi(d+x)} \quad (1)$$

In a case where the dielectric 6 is not a vacuum layer, assuming that the relative permittivity of the dielectric 6 is $\varepsilon_r$ and the dielectric constant of vacuum is $\varepsilon_0$, the dielectric constant between the conductor plate 2 and the linear conductor 3 is $\varepsilon_r \times \varepsilon_0$. As illustrated in FIG. 6, the linear conductor 3 has a rectangular shape, when viewed from the side (as viewed in a −z direction), of a/2 (m) in an x-axis direction and b (m) in a y-axis direction.

Figure 7:
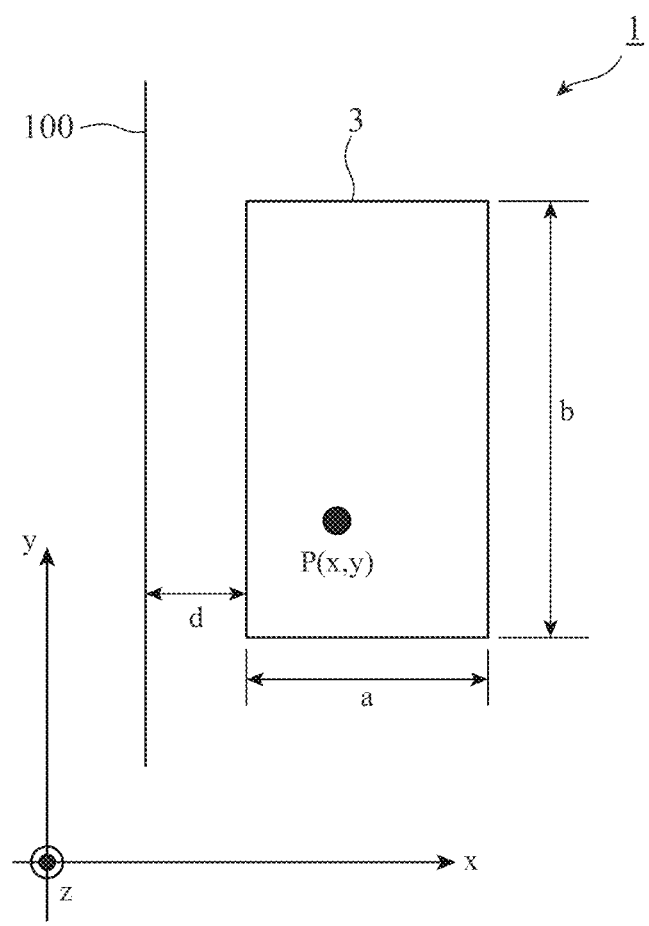
FIG. 7 is an explanatory diagram illustrating a positional relationship between the electromagnetic field sensor according to the first embodiment and the cable in a case where the electric image method is applied.

FIG. 7 is an explanatory diagram illustrating a positional relationship between the electromagnetic field sensor 1 and the cable 100 in a case where the electric image method is applied. Assuming that the conductor plate 2 is sufficiently larger (about three times or more larger) than the linear conductor 3, the conductor plate 2 is a conductor plane, and the electric image method illustrated in FIG. 7 is established. An interlinkage magnetic flux Φ formed by the conductor plate 2 and the linear conductor 3 can be represented by the following equation (2). Note that the state where the conductor plate 2 is "sufficiently larger" than the linear conductor 3 cannot be uniformly defined because the state changes depending on the frequency of a device under test signal. However, when the frequency of the device under test signal increases, a current flows only in the conductor plate 2 immediately under the linear conductor 3 due to the skin effect. As a result, in a case where the frequency of the device under test signal is high, even if the size of the conductor plate 2 is small, the conductor plate 2 can be regarded as being sufficiently large in view of the electric image method. In addition, "about three times or more larger" is a condition at about 10 (MHz), and in a case where the device under test signal has a lower frequency, it is desirable to further enlarge the conductor plate 2.

$$\Phi = \int_0^a \int_0^b \mu_0 H d \times dy \quad (2)$$

By calculating the equation (2), the interlinkage magnetic flux Φ is represented by the following equation (3).

$$\Phi = \frac{\mu_0 I b}{2\pi} \log \frac{d+a}{d} \quad (3)$$

Since a mutual inductance $M_{new}$ can be represented by $\Phi = M_{new} I$, the mutual inductance $M_{new}$ is represented by the following equation (4).

$$M_{new} = \frac{\mu_0 b}{2\pi} \log \frac{d+a}{d} \quad (4)$$

In comparison with the electromagnetic field sensor 1, a mutual inductance $M_{old}$ in a conventional electromagnetic field sensor in which the conductor plate 2 is not provided and the area of the loop plane is equal to that in the electromagnetic field sensor 1 can be represented by the following equation (5).

$$M_{old} = \frac{\mu_0 b}{2\pi} \log \frac{d+\frac{a}{2}}{d} \quad (5)$$

In the equation (4) and the equation (5), in a case where d>0 and a>0 (this is always true if there is a physical size), $M_{new} > M_{old}$ is satisfied. In a case where the mutual inductance is M (H), the voltage V between the conductor plate 2 and the signal output terminal 4 can be represented by the following equation (6). Note that |·| means an absolute value.

$$|V| = M \left| \frac{dI}{dt} \right| \quad (6)$$

As can be seen from the equation (6), as M increases, the voltage V between the conductor plate 2 and the signal output terminal 4 also increases. As a result, the electromagnetic field sensor 1 can have higher detection sensitivity than the conventional electromagnetic field sensor that does not include the conductor plate 2.

In a case where the measurement device is an oscilloscope or a spectrum analyzer, it is common to receive a signal using a 50Ω system. The coaxial connector and the coaxial cable also include the 50Ω system. As a result, by using a coaxial connector for the connector 7 and setting the characteristic impedance on the side of the electromagnetic field sensor 1 to 50 (Ω), which is the same as that of the coaxial connector and the coaxial cable, it is possible to prevent reflection of a signal due to impedance mismatch between the coaxial connector, the coaxial cable, and the measurement device. By preventing the reflection of the signal, all the energy detected by the electromagnetic field sensor 1 can be output to the measurement device, and the detection sensitivity is improved.

For example, the characteristic impedance of the linear conductor 3A with respect to the conductor plate 2A is desirably 50 (Ω). In order to obtain a characteristic impedance of 50Ω, it is necessary to adjust the width of the linear conductor 3A after grasping the thickness of the conductor plate 2A, the thickness of the linear conductor 3A, the thickness of the dielectric 6, and the relative permittivity. For example, in a case where FR-4 whose relative permittivity is about 4 to 4.3 is used as the material of the dielectric 6, the width of the linear conductor 3A is desirably about twice the thickness of the dielectric 6. The adjustment value of the characteristic impedance can be easily calculated using a theoretical formula or a known electromagnetic field simulator.

By inputting an AC signal to the signal output terminal 4 of the electromagnetic field sensor 1, the magnetic flux formed around the electromagnetic field sensor 1 can have a signal component, and an electromagnetic field sensor 1 prepared separately from the electromagnetic field sensor 1 can detect an AC signal obtained by the magnetic flux. As a result, information can be transmitted between the electromagnetic field sensors 1. Note that it is not always necessary to use both the electromagnetic field sensors 1, and at least one electromagnetic field sensor 1 can be used.

In addition, the electromagnetic field sensor 1 can be used when a signal that becomes noise is locally applied in a test (called an immunity test or an EMS test in the field of EMC) for checking the noise resistance of a device. For example, a noise signal is input to the signal output terminal 4 of the electromagnetic field sensor 1, the electromagnetic field sensor 1 is brought close to the device under test, and whether or not the device under test malfunctions or is damaged due to the noise signal is checked. In this case, when the current generated in the device under test by the applied noise signal is large, it is necessary to increase the cross-sectional area of the linear conductor 3A so as not to exceed the maximum current capacity of a wire. In addition, in a case where the voltage of the applied signal is large, it is necessary to increase the distance between the conductors to which the voltage is applied so as not to exceed the insulation breakdown voltage.

Note that, in the electromagnetic field sensor 1 according to the first embodiment, since the conductor plate 2 is provided, a magnetic field can be applied only to the linear conductor 3 on the side of the device to which noise is applied. In a normal sensor without the conductor plate 2, a magnetic field is generated around the sensor, and thus there is a possibility that a device that is not a device under test (DUT) malfunctions or is damaged. On the other hand, in the electromagnetic field sensor 1 according to the first embodiment, it is possible to reduce the possibility that the device that is not a device under test (DUT) malfunctions or is damaged.

As described above, the electromagnetic field sensor 1 according to the first embodiment includes one conductor plate 2 and the linear conductor 3 in which one end 3a is connected to one face of the conductor plate 2 and the signal output terminal 4 is provided at the other end 3b, and also includes the loop plane 21 that is formed by the conductor plate 2 and the linear conductor 3 and is orthogonal to the conductor plate 2 when viewed from the side. As the magnetic flux generated around the cable 100 penetrates the loop plane 21, an induced electromotive force is generated in the loop plane 21, and an alternating current generated in the cable 100 by the induced electromotive force is measured with high sensitivity. As a result, the electromagnetic field sensor 1 can improve the detection sensitivity of the alternating current.

The electromagnetic field sensor 1A according to the first embodiment includes the via 5 passing through the dielectric 6 provided between the conductor plate 2A and the linear conductor 3A, and the via 5 electrically connects the face of the conductor plate 2A and the linear conductor 3A. As the magnetic flux generated around the cable 100 penetrates the loop plane 21, an induced electromotive force is generated in the loop plane 21, and an alternating current generated in the cable 100 by the induced electromotive force is measured with high sensitivity. As a result, the electromagnetic field sensor 1A can improve the detection sensitivity of the alternating current.

Second Embodiment

Figure 8:
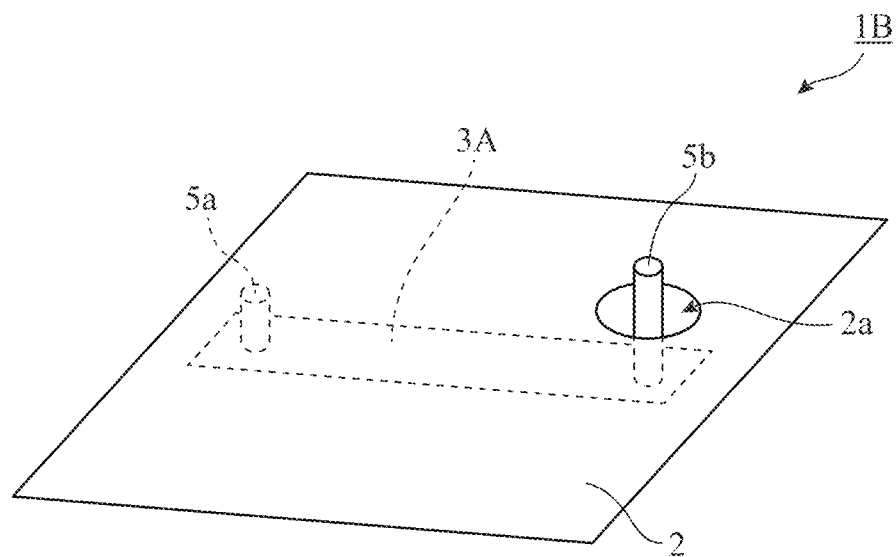
FIG. 8 is a perspective view illustrating an electromagnetic field sensor according to a second embodiment.

FIG. 8 is a perspective view illustrating an electromagnetic field sensor 1B according to a second embodiment. In FIG. 8, the electromagnetic field sensor 1B is, for example, a sensor that detects an alternating current flowing through a cable, and includes the conductor plate 2, the linear conductor 3A, a via 5a, and a via 5b. The linear conductor 3A is disposed in parallel with the conductor plate 2. The via 5a is a first columnar conductor that electrically connects the conductor plate 2 and one open end of the linear conductor 3A. The via 5b is a second columnar conductor that is electrically connected to the other open end of the linear conductor 3A and projects to the side opposite to the linear conductor 3A through a through-hole 2a provided in the conductor plate 2.

The conductor plate 2 and the linear conductor 3A form a loop plane surrounded by the shortest path starting from one open end of the linear conductor 3A and returning to the side of the one open end of the linear conductor 3A via the linear conductor 3A, the via 5a, and the conductor plate 2, when viewed from the side. The loop plane is orthogonal to the plate face of the conductor plate 2. The via 5b is provided at the one open end of the linear conductor 3A.

Figure 9:
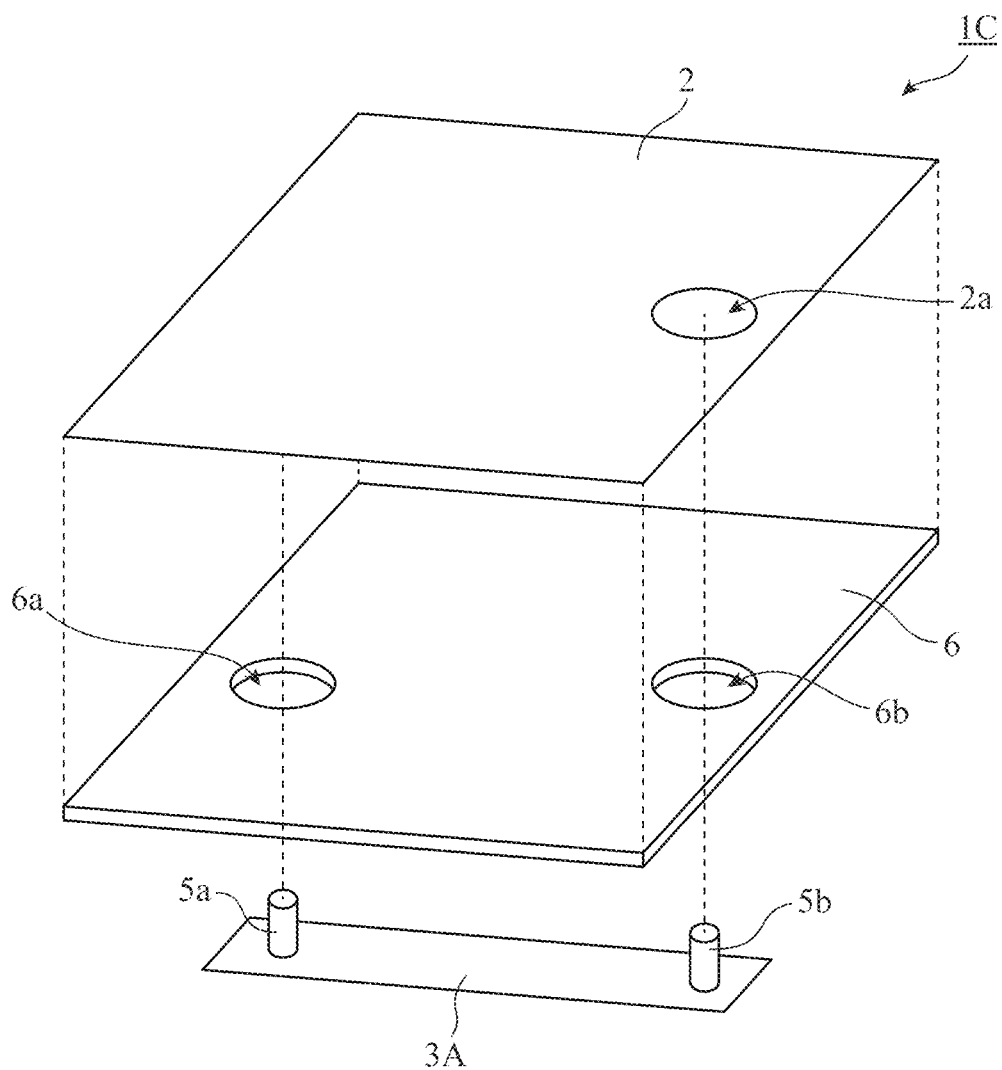
FIG. 9 is am exploded perspective view illustrating a modification of the electromagnetic field sensor according to the second embodiment.

FIG. 9 is an exploded perspective view illustrating a configuration of an electromagnetic field sensor 1C, which is a modification of the electromagnetic field sensor 1B, in which the dielectric 6 is provided between the conductor plate 2 and the linear conductor 3A. As illustrated in FIG. 9, the dielectric 6 includes the through-hole 6a and a through-hole 6b. The through-hole 6a is a first through-hole that forms a clearance through which the via 5a passes. The conductor plate 2 and the linear conductor 3A are electrically connected by the via 5a passing through the through-hole 6a in the dielectric 6. The through-hole 6b is a second through-hole that forms a clearance through which the via 5b passes. The via 5b electrically connected to the end of the linear conductor 3A projects from the conductor plate 2 through the through-hole 6b in the dielectric 6 and the through-hole 2a in the conductor plate 2. That is, the via 5b is a portion corresponding to the signal output terminal 4 in the electromagnetic field sensors 1B and 1C.

Figure 10:
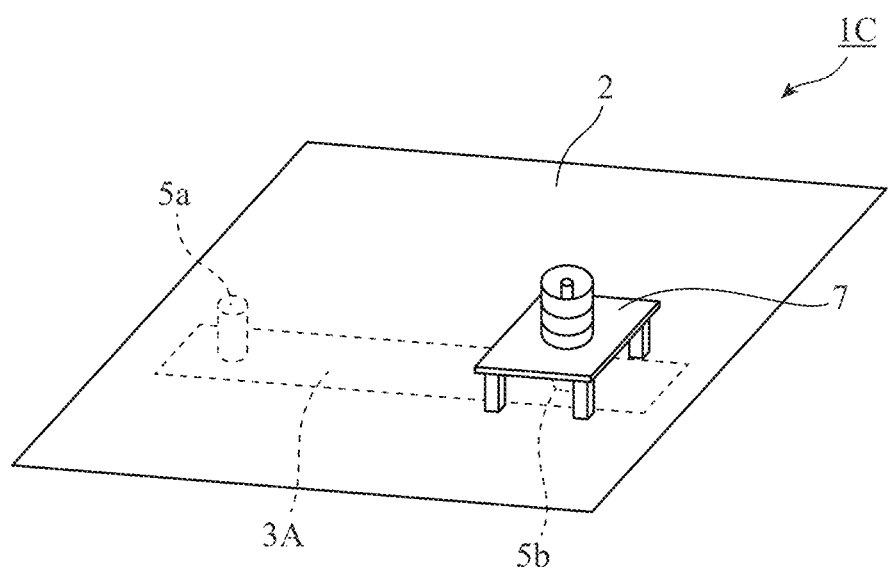
FIG. 10 is a perspective view illustrating the electromagnetic field sensor of FIG. 9 to which a connector is attached.

FIG. 10 is a perspective view illustrating the electromagnetic field sensor 1C to which the connector 7 is attached. In FIG. 10, the connector 7 is a coaxial connector. In the electromagnetic field sensor 1C illustrated in FIG. 10, the connector 7 is disposed on the side opposite to a device under test (DUT). In the electromagnetic field sensor 1C, the via 5b is electrically connected to the core wire of the connector 7, and the outer conductor of the connector 7 is electrically connected to the conductor plate 2. The connection method is preferably soldering. In addition, FIG. 10 illustrates a state where the outer conductor of the connector 7 has four supports and the connector 7 is connected to the conductor plate 2 via the supports. However, the conductor face (the face to which the support is attached) of the outer conductor of the connector 7 may be directly electrically connected to the conductor plate 2 by soldering or the like without using the support. By directly connecting the conductor face of the connector 7 to the conductor plate 2 as described above, it is possible to suppress external noise from being superimposed on the via 5, to shorten a via in which the characteristic impedance is likely to change, and to reduce reflection at a connection portion between the electromagnetic field sensor and the connector. In particular, in the case of measuring a high-frequency band equal to or higher than 10 (MHz), the electromagnetic field sensor 1 with high sensitivity can be obtained. Note that the electromagnetic field sensor 1C is not limited to this structure.

Since noise is shielded by the conductor plate 2, the electromagnetic field sensor 1C can detect an alternating current without the connector 7 being affected by the electromagnetic field from the device under test, that is, without the connector 7 itself becoming a part of the electromagnetic field sensor. As a result, the electromagnetic field sensor 1C can suppress the influence of the electromagnetic field from the device under test as compared with the electromagnetic field sensor 1 or 1A. Furthermore, in the electromagnetic field sensor 1C, since the connector 7 is not provided on the side face portion of the dielectric 6, the linear conductor 3A can be disposed near the device under test. Therefore, in the electromagnetic field sensor IC, the detection sensitivity is improved, and the S/N ratio (the ratio of a signal to noise) is also improved.

Figure 11:
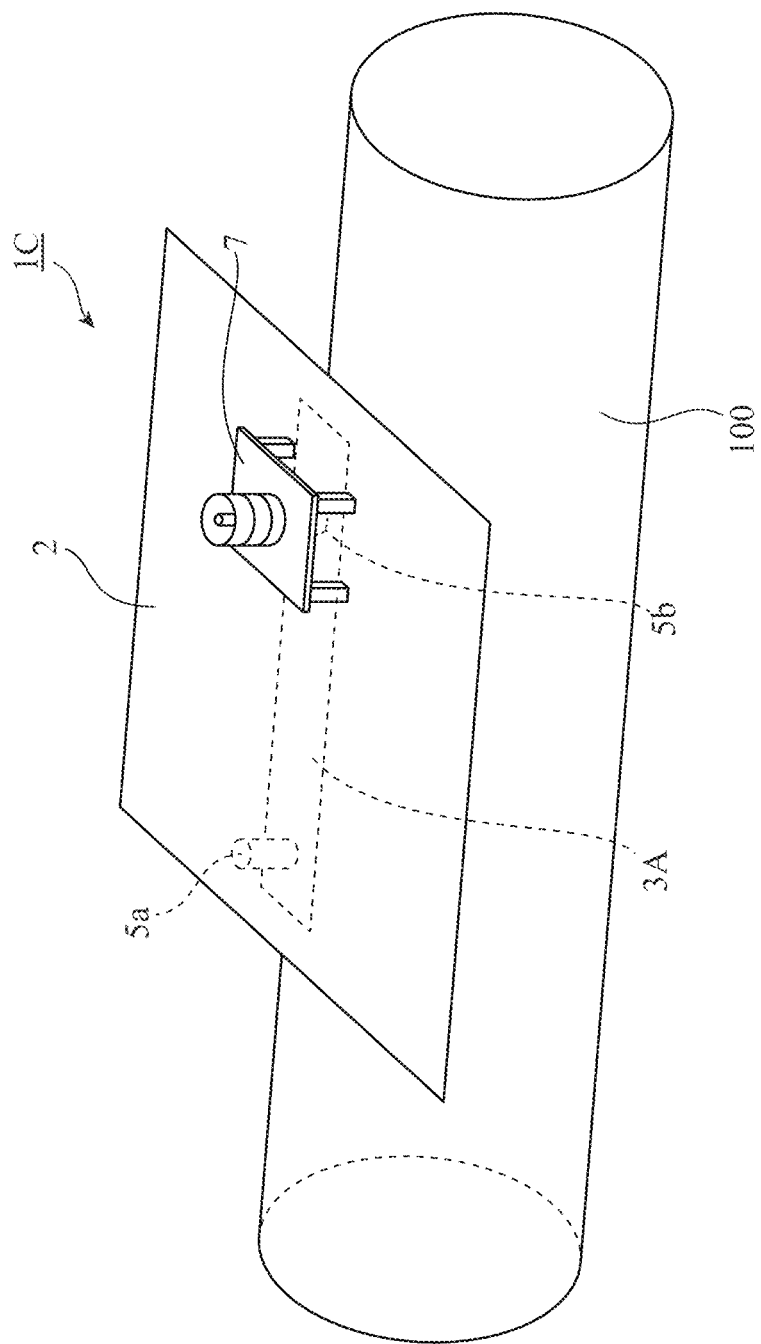
FIG. 11 is an explanatory diagram illustrating the outline of detection of a high-frequency signal by the electromagnetic field sensor in FIG. 10.
Figure 12:
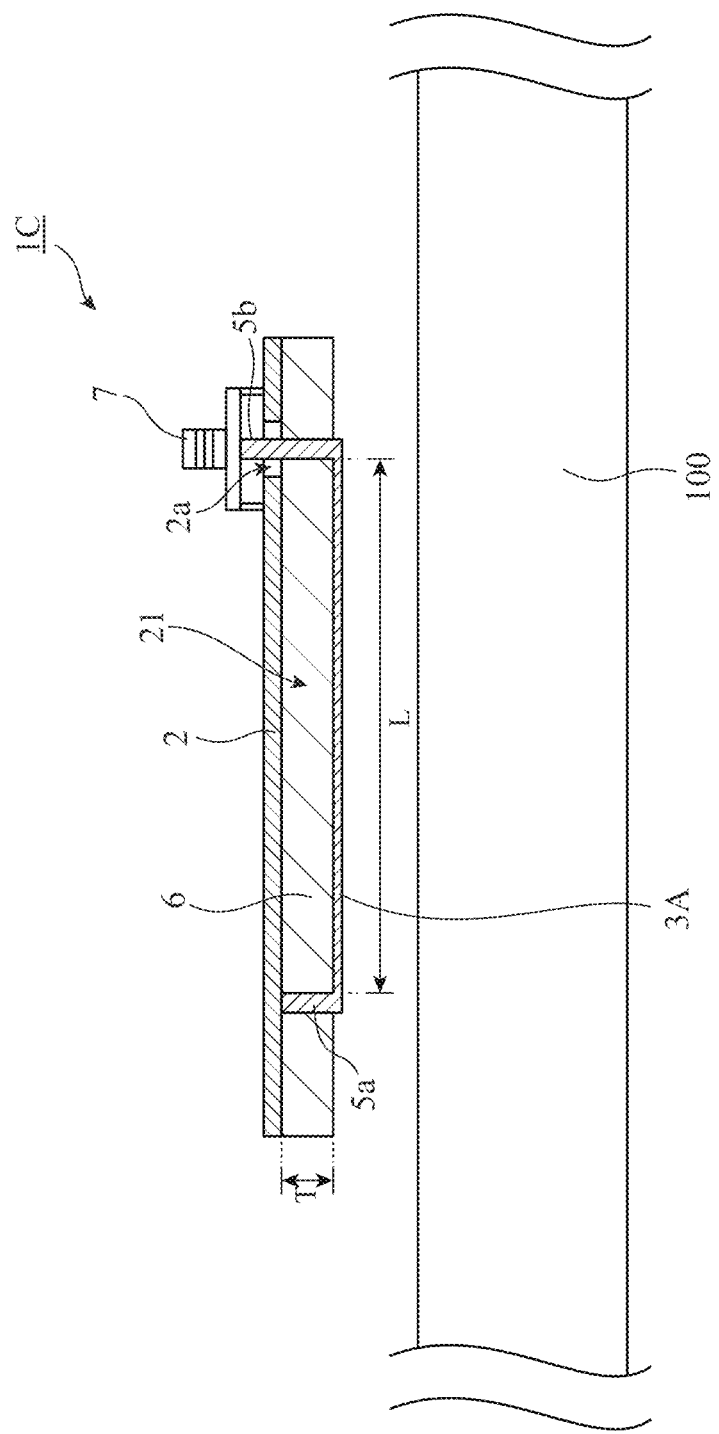
FIG. 12 is an explanatory diagram illustrating a positional relationship between the electromagnetic field sensor in FIG. 10 and a cable.

FIG. 11 is an explanatory diagram illustrating the outline of detection of a high-frequency signal by the electromagnetic field sensor 1C in FIG. 10, and illustrates a case where the device under test is the cable 100. FIG. 12 is an explanatory diagram illustrating a positional relationship between the electromagnetic field sensor 1C in FIG. 10 and the cable 100. As illustrated in FIGS. 11 and 12, the electromagnetic field sensor 1C is disposed with the linear conductor 3A facing the side of the cable 100. Furthermore, the electromagnetic field sensor 1C is disposed in such a way that the longitudinal direction of the linear conductor 3A and the longitudinal direction of the cable 100 are in the same direction. The detection sensitivity of the electromagnetic field sensor 1C is maximized by matching the longitudinal direction of the linear conductor 3A to the known current flow direction of the device under test. Furthermore, by sandwiching a dielectric with a material constant such as a relative permittivity and a constant thickness between the electromagnetic field sensor 1C and the cable 100, the detection sensitivity of the magnetic field generated from the cable 100 can be made constant. That is, since the distance between the cable 100 and the electromagnetic field sensor 1C can be made constant, measurement with good reproducibility can be performed. In the second embodiment, the dielectric can include a dielectric layer of a printed circuit board.

Figure 13:
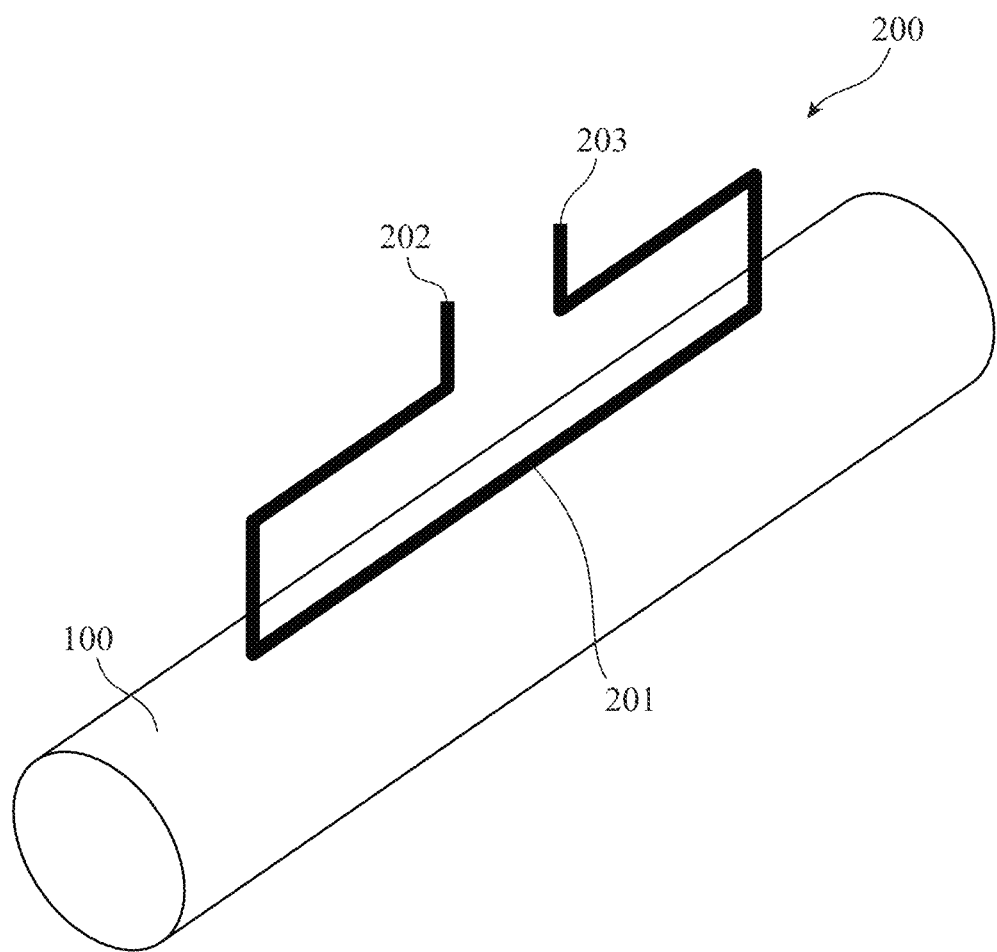
FIG. 13 is a perspective view illustrating a virtual electromagnetic field sensor without a conductor plate and the cable.
Figure 14:
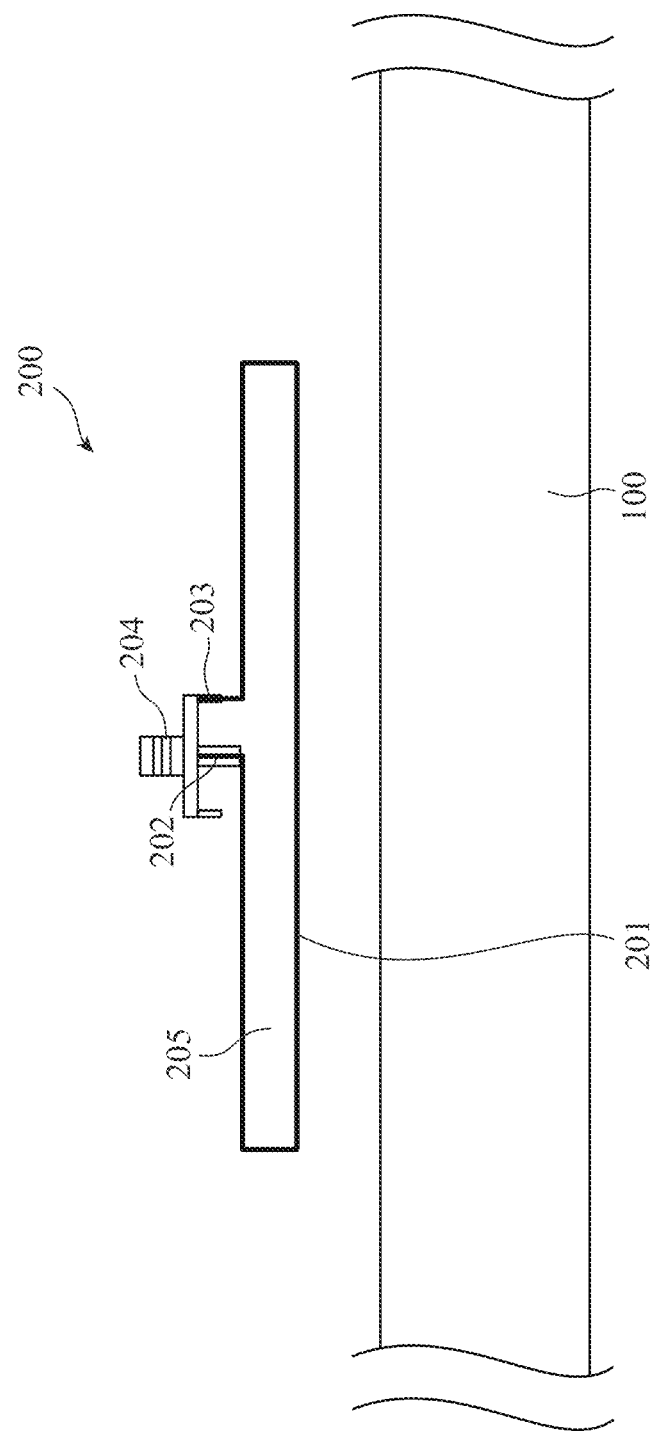
FIG. 14 is an explanatory diagram illustrating a positional relationship between the electromagnetic field sensor in FIG. 13 and the cable.

FIG. 13 is a perspective view illustrating a virtual electromagnetic field sensor 200 without a conductor plate and the cable 100. FIG. 14 is an explanatory diagram illustrating a positional relationship between the electromagnetic field sensor 200 in FIG. 13 and the cable 100. In the electromagnetic field sensor 200, the core wire of a coaxial connector 204 is electrically connected to a terminal 202 provided at one end of a linear conductor 201, and the outer conductor of the coaxial connector 204 is connected to a terminal 203 provided at the other end of the linear conductor 201.

The measurement device measures a potential difference between the terminal 203 that is the outer conductor of the coaxial connector 204 and the terminal 202 that is the core wire of the coaxial connector 204 via a coaxial cable. In the electromagnetic field sensor 200, the linear conductor 201 is disposed along the longitudinal direction of the cable 100 in such a way that the magnetic flux penetrating a loop plane 205 surrounded by the linear conductor 201 when viewed from the side is maximized and the detection sensitivity thereof is also maximized.

Figure 15:
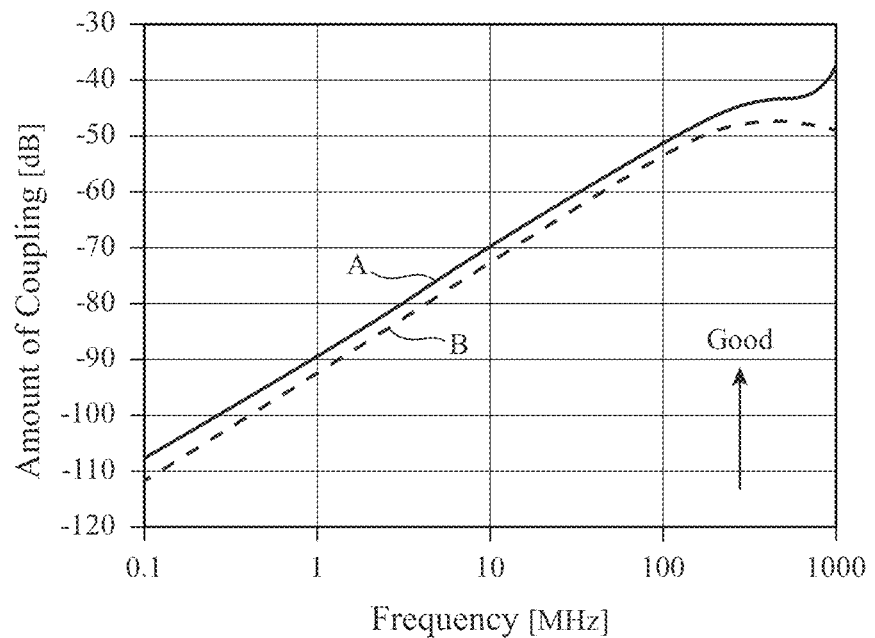
FIG. 15 is a graph illustrating a relationship between the frequency of a detection signal and the amount of coupling in the electromagnetic field sensors in FIGS. 12 (line A in FIG. 15) and 13 (line B in FIG. 15).

FIG. 15 is a graph illustrating a relationship between the frequency of a detection signal and the amount of coupling in the electromagnetic field sensor 1C and the electromagnetic field sensor 200. In FIG. 15, the relationship denoted by reference numeral A is a simulation calculation result indicating the relationship between the frequency of the detection signal and the amount of coupling in the electromagnetic field sensor 1C, and the relationship denoted by reference numeral B is a simulation calculation result indicating the relationship between the frequency of the detection signal and the amount of coupling in the electromagnetic field sensor 200. As illustrated in FIG. 12, in the electromagnetic field sensor 1C, the length of the loop plane 21 in the longitudinal direction is L, and the thickness of the dielectric 6 is T.

The relationship illustrated in FIG. 15 is a result of simulation calculation on the assumption that the area of the loop plane 205 surrounded by the linear conductor 201 included in the electromagnetic field sensor 200 when viewed from the side and the area of the loop plane 21 surrounded by the conductor plate 2 and the linear conductor 3A included in the electromagnetic field sensor 1C when viewed from the side are both 12 (mm2) (=0.3 (mm) (the thickness T of the dielectric 6)×40 (mm) (the length L of the loop plane 21 in the longitudinal direction)). Existing analysis software (for example, CST Studio from AET) was used for the simulation calculation, and the evaluation was performed using the ratio of an output of an electromagnetic field sensor to cable injection (the transmission characteristic S21 among the S parameters corresponds to the amount of coupling).

The nearest distance d between the cable 100 and the linear conductor 3A or 201 is 1 (mm), and the widths of the linear conductors 3A and 201 are 1 (mm). Furthermore, copper foil is used for the linear conductors 3A and 201, and the thickness of the copper foil is 18 (μm). The dielectric 6 includes R-4 with a relative permittivity of 4.0. The thickness of the cable 100, which is a device under test (DUT), is 10 (mm), the length of the conductor plate 2 along the longitudinal direction of the cable 100 is 45 (mm), and the dimension in the width direction is 20 (mm), that is, twice the thickness of the cable 100.

The relationship illustrated in FIG. 15 is calculated assuming that the horizontal axis represents the frequency and the vertical axis represents the transmission characteristic (S21 among the S parameters), and no connector is provided because the characteristics of the electromagnetic field sensor themselves are compared. The graph shown in FIG. 15 is a double logarithmic graph. As indicated by an arrow in the graph of FIG. 15, the larger the value of the transmission characteristic, the higher the detection sensitivity of a signal (Good).

As is clear from FIG. 15, under the conditions described above, the transmission characteristics of the electromagnetic field sensor 1C and the electromagnetic field sensor 200 change monotonically up to 100 (MHz), and increase by 20 (dB/dec). Note that dec is an abbreviation of decade and means ten times. Comparing the absolute value of the transmission characteristic of the electromagnetic field sensor 1C and the absolute value of the transmission characteristic of the electromagnetic field sensor 200, the detection sensitivity of the electromagnetic field sensor 1C is higher by about 6 (dB). As a result, the output voltage, that is, detection sensitivity of the electromagnetic field sensor 1C is about twice, which is an antilog, as large as that of the electromagnetic field sensor 200.

Figure 16:
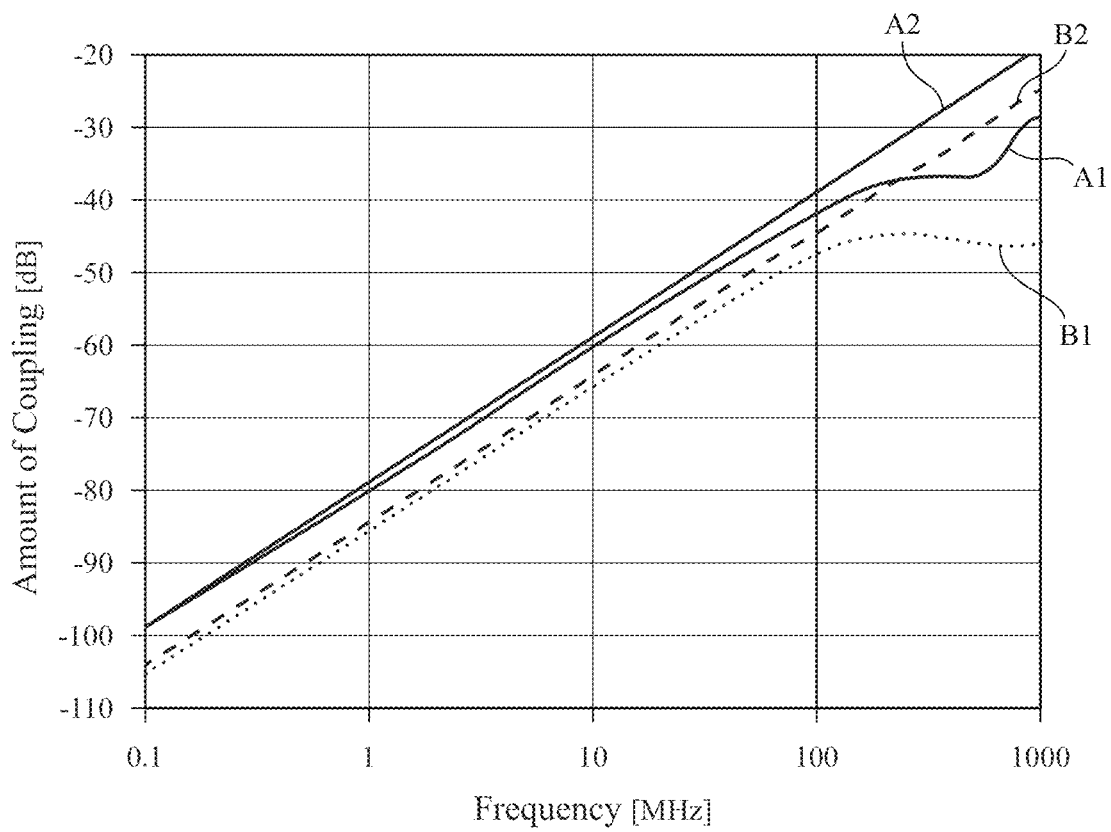
FIG. 16 is a graph illustrating a relationship between the result of three-dimensional electromagnetic field simulation of the frequency of the detection signal and the amount of coupling in the electromagnetic field sensor, and theoretical values.

The simulation calculation result in FIG. 15 can be predicted using the equations (4) and (5), which are theoretical formulas. FIG. 16 is a graph illustrating a relationship between the results of three-dimensional electromagnetic field simulation of the frequency of the detection signal and the amount of coupling in the electromagnetic field sensors 1C and 200, and theoretical values. In FIG. 16, the relationship denoted by reference numeral A1 is a simulation calculation result indicating the relationship between the frequency of the detection signal and the amount of coupling in the electromagnetic field sensor 1C, and the relationship denoted by reference numeral B1 is a simulation calculation result indicating the relationship between the frequency of the detection signal and the amount of coupling in the electromagnetic field sensor 200. The relationship denoted by reference numeral A2 is a theoretical value of the relationship between the frequency and the amount of coupling in the electromagnetic field sensor 1C, which is calculated in accordance with the equation (4), and the relationship denoted by reference numeral B2 is a theoretical value of the relationship between the frequency and the amount of coupling in the electromagnetic field sensor 200, which is calculated in accordance with the equation (5).

When the relationship denoted by reference numeral A1 is compared with the relationship denoted by reference numeral A2, as illustrated in FIG. 16, the theoretical value is larger by about 2 (dB) at 100 (MHz), and the relationships are almost the same up to about 100 (MHz). In a band equal to or higher than 100 (MHz), a component other than magnetic field coupling and a parasitic capacitance between the cable 100 and the electromagnetic field sensor 1C are generated, and thus the characteristics change. The reason for the difference of about 2 (dB) is that the size of the conductor plate 2 is assumed to be infinite, and the thicknesses of the linear conductor 3A and the cable 100 are assumed to be infinitesimal in theoretical calculation, and these sizes are different from the actual dimensions.

When the relationship denoted by reference numeral B1 is compared with the relationship denoted by reference numeral B2, as illustrated in FIG. 16, the theoretical value is larger by about 2 (dB), but the relationships are almost the same at a frequency equal to or higher than 100 (MHz). Similarly to the electromagnetic field sensor 1C, in the electromagnetic field sensor 200, a difference occurs due to electric field coupling with the cable 100 in a band equal to or smaller than 100 (MHz).

Effects of providing the conductor plate 2 in the electromagnetic field sensor 1 include an improvement in ease of manufacturing and use of the electromagnetic field sensor 1. In the electromagnetic field sensor 200, the connector 7 and a part of the coaxial cable or the twisted pair cable connected to the connector 7 function as an electromagnetic field sensor, and disturb electromagnetic field characteristics around the cable 100 that is a device under test (DUT). For this reason, it is necessary to perform design in consideration of the shape of the connector 7, the attachment position to the cable 100, and the routing of the coaxial cable, and if these are not designed, the measurement results vary depending on the usage method of a user, and thus it is difficult to perform reproducible measurement.

Since the conductor plate 2 is provided between the cable 100 and the connector 7 in the electromagnetic field sensor 1C, the influence of the electric field component and the magnetic field component from the cable 100 on the connector 7 and the coaxial cable connected to the end of the connector 7 is suppressed. As a result, the coaxial connector and the coaxial cable can be attached without depending on the shape of the connector 7, the attachment position to the device under test, and the routing of the coaxial cable. Therefore, when considering the shape of the connector 7 and the attachment position to the device under test, redesign is unnecessary, and the designer can use any coaxial connector.

Furthermore, in the electromagnetic field sensor 200, it is necessary to increase the distance between the device under test and the coaxial connector 204 in order to remove the electromagnetic field component from the device under test, but in the electromagnetic field sensor 1C, the conductor plate 2 is provided and thus it is not necessary to increase the distance between the device under test and the connector 7. As a result, since the electromagnetic field sensor 1C can be disposed in the vicinity of the device under test, the electromagnetic field sensor 1C can be downsized.

Figure 17:
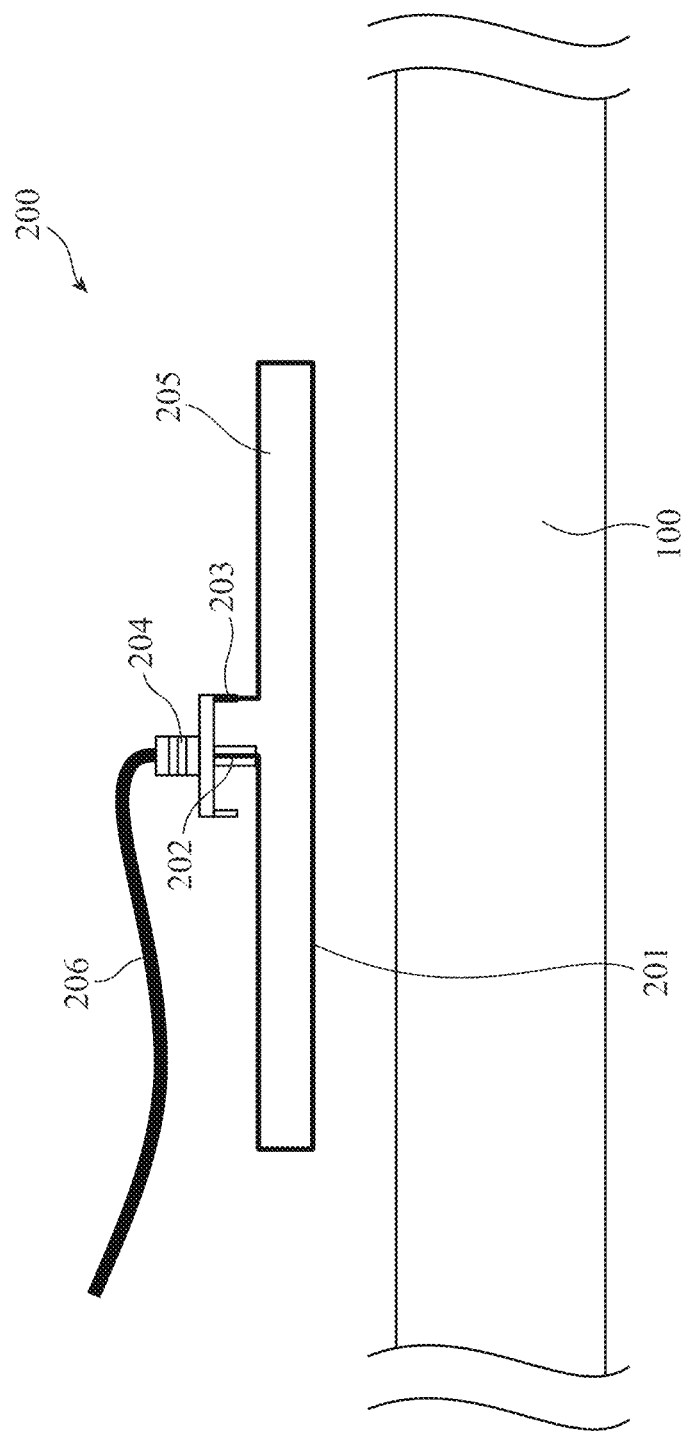
FIG. 17 is an explanatory diagram illustrating a positional relationship between the electromagnetic field sensor of FIG. 13 to which a coaxial cable is attached and the cable.

FIG. 17 is an explanatory diagram illustrating a positional relationship between the electromagnetic field sensor 200 to which a coaxial cable 206 is connected and the cable 100, and illustrates the outline of measurement of an electromagnetic field generated from the cable 100. As illustrated in FIG. 17, the electromagnetic field sensor 200 to which the coaxial connector 204 is attached has a structure (a pigtail structure) in which the outer conductor of the coaxial connector 204 is connected to the electromagnetic field sensor 200 at one point. For this reason, the noise resistance performance of the electromagnetic field sensor 200 is degraded. Since the coaxial connector 204 and the coaxial cable 206 are arranged in the electromagnetic field generated around the cable 100, characteristics including the coaxial connector 204 and the coaxial cable 206 are obtained.

Figure 18:
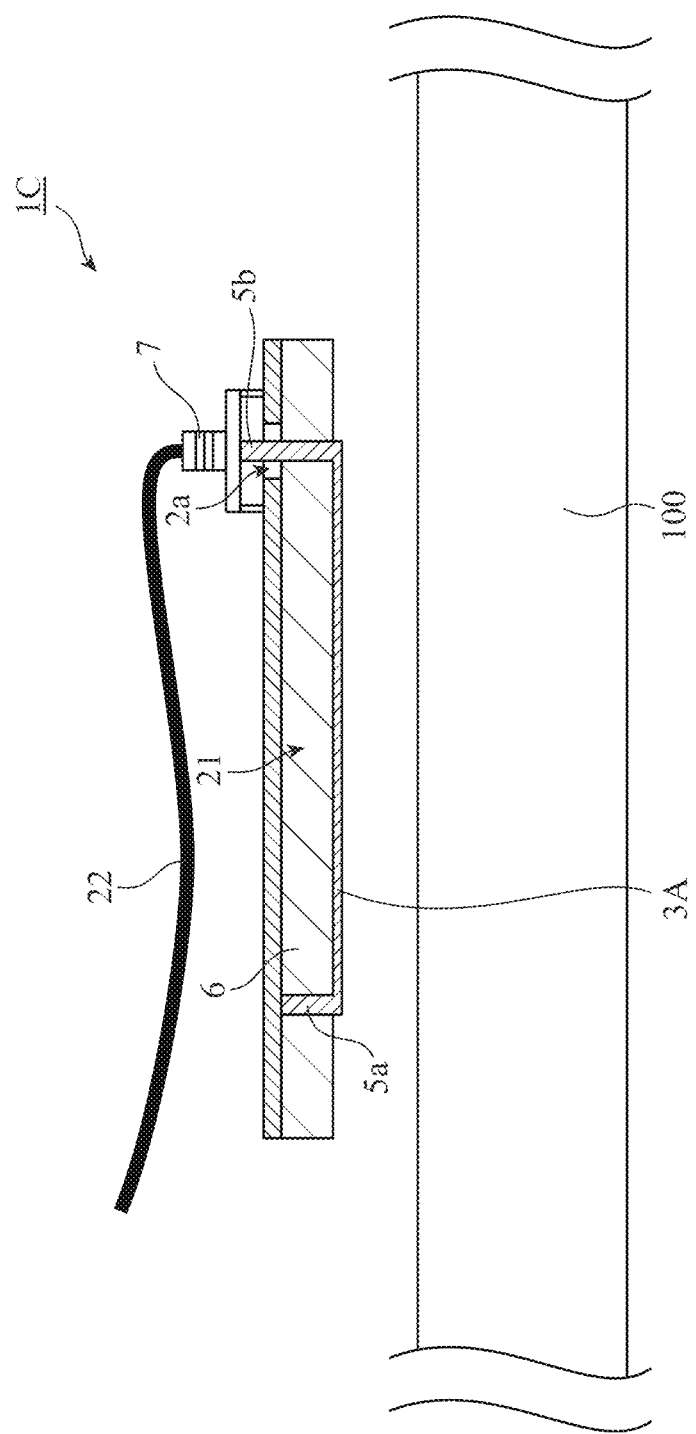
FIG. 18 is an explanatory diagram illustrating a positional relationship between the electromagnetic field sensor of FIG. 10 in which a coaxial cable is attached to a connector and the cable.

FIG. 18 is an explanatory diagram illustrating a positional relationship between the electromagnetic field sensor 1C in which the coaxial cable 22 is connected to the connector 7 and the cable 100, and illustrates the outline of measurement of an electromagnetic field generated from the cable 100. In the electromagnetic field sensor 1C, the connector 7, which is a coaxial connector, can be attached to the conductor plate 2. That is, the via 5b extending from the linear conductor 3A is connected to the core wire of the connector 7, and the outer conductor of the connector 7 is electrically connected to the conductor plate 2. As described above, in the electromagnetic field sensor 1C, since the outer conductor of the coaxial connector can be connected to the electromagnetic field sensor 1C on a face or at a plurality of points, the noise resistance performance is improved.

As described above, the electromagnetic field sensor 1C according to the second embodiment includes the via 5a passing through the dielectric 6 provided between the conductor plate 2 and the linear conductor 3A, and the via 5b passing through the through-hole 2a provided in the conductor plate 2. The via 5b is connected to the linear conductor 3A and projects from the conductor plate 2 through the through-hole 2a. Since the electromagnetic field generated around the cable 100 is shielded by the conductor plate 2, the electromagnetic field does not make an influence on the coaxial connector or reduces the influence on the coaxial connector on the side opposite to the linear conductor 3A with respect to the conductor plate 2. The coaxial cable 22 is similar to the coaxial connector, and since the electromagnetic field generated around the cable 100 is shielded by the conductor plate 2, electromagnetic field coupling to the coaxial cable 22 can also be reduced. As a result, in the electromagnetic field sensor 1C, the influence of the routing of the coaxial cable 22 is reduced. Furthermore, since the outer conductor of the coaxial connector can be connected to the plate face of the conductor plate 2, an external force is easily applied to the conductor plate 2 that is larger than the coaxial connector, and is less likely to be directly applied to the coaxial connector. As a result, the electromagnetic field sensor 1C has a structure that is strong against breakage and distortion due to an external force. In particular, when the connector and the cable are attached or detached, or in an environment in which vibration is applied, such as a vehicle interior, a force is applied to the electromagnetic field sensor or the connector, which causes breakage or distortion that reduces measurement reproducibility. However, the electromagnetic field sensor 1C according to the second embodiment has a structure strong against such an external force.

Third Embodiment

Figure 19:
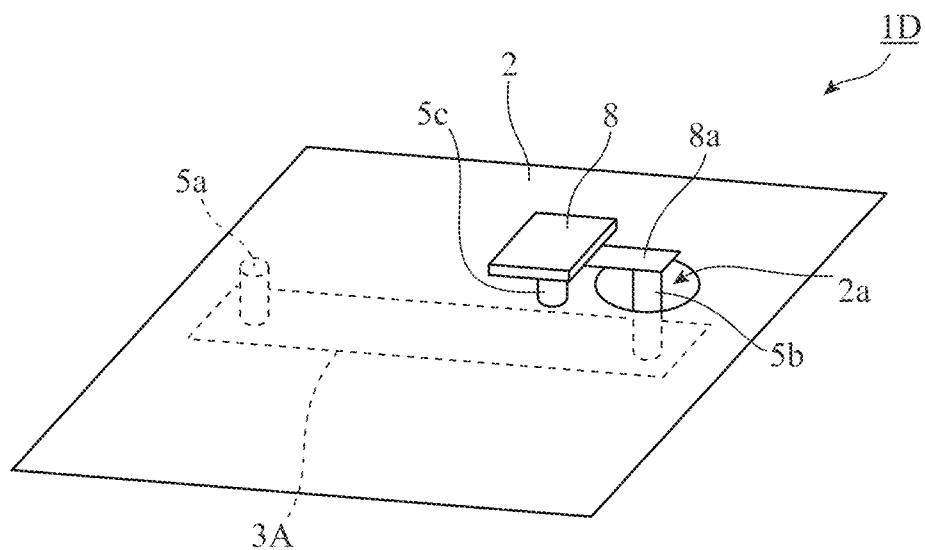
FIG. 19 is a perspective view illustrating an electromagnetic field sensor according to a third embodiment.

FIG. 19 is a perspective view illustrating an electromagnetic field sensor 1D according to a third embodiment. The electromagnetic field sensor 1D is, for example, a sensor that detects an alternating current flowing through a cable, and includes the conductor plate 2, the linear conductor 3A, the via 5a, the via 5b, a via 5c, a detection circuit 8, and a wire 8a. The linear conductor 3A is disposed in parallel with the conductor plate 2.

The via 5a is a first columnar conductor that electrically connects the conductor plate 2 and one open end of the linear conductor 3A. The via 5b is a second columnar conductor that is electrically connected to the other open end of the linear conductor 3A and projects to the side opposite to the linear conductor 3A through the through-hole 2a provided in the conductor plate 2. The via 5c is a columnar conductor (also referred to as a ground via) that electrically connects the ground of the detection circuit 8 and the conductor plate 2.

As illustrated in FIG. 19, the detection circuit 8 is a circuit that is provided on the plate face of the conductor plate 2 opposite to the linear conductor 3A and detects a potential difference between the conductor plate 2 and the linear conductor 3A. One end of the wire 8a is connected to the via 5b projecting from the conductor plate 2, and the other end is connected to the detection circuit 8. For example, the wire 8a is a microstrip line or a strip line that electrically connects the via 5b and the detection circuit 8.

Figure 20:
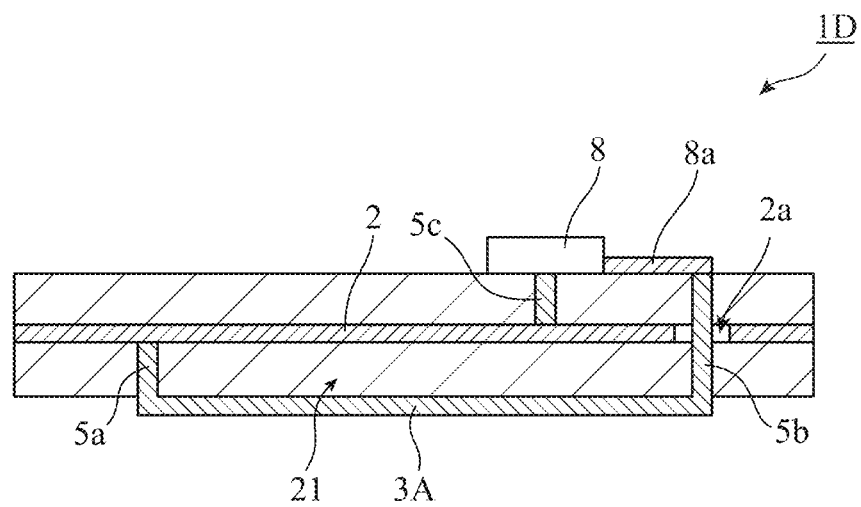
FIG. 20 is a cross-sectional view illustrating an internal structure of the electromagnetic field sensor according to the third embodiment.

FIG. 20 is a cross-sectional view illustrating an internal structure of the electromagnetic field sensor 1D. In FIG. 20, the electromagnetic field sensor 1D includes a three-layer printed circuit board, the linear conductor 3A is provided on the first layer, the conductor plate 2 is provided on the second layer, which is an inner layer, and the detection circuit 8 is provided on the third layer. The input port of the detection circuit 8 is electrically connected to the via 5b by the wire 8a, and the ground of the detection circuit 8 is electrically connected to the conductor plate 2 by the via 5c. Note that FIG. 20 illustrates the three-layer printed circuit board, the printed circuit board may include at least three or more conductor layers.

The conductor plate 2 and the linear conductor 3A form the loop plane 21 surrounded by the shortest path starting from one end of the linear conductor 3A connected to the via 5b and returning to the side of the one end of the linear conductor 3A via the linear conductor 3A, the via 5a, and the conductor plate 2, when viewed from the side. The loop plane 21 is orthogonal to the plate face of the conductor plate 2.

Figure 21:
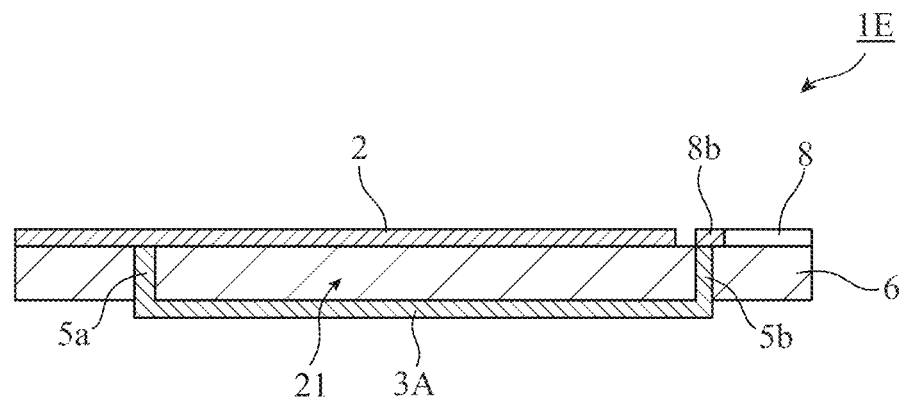
FIG. 21 is a cross-sectional view illustrating an internal structure of a modification A of the electromagnetic field sensor according to the third embodiment.

FIG. 21 is a cross-sectional view illustrating an internal structure of an electromagnetic field sensor 1E, which is a modification A of the electromagnetic field sensor 1D according to the third embodiment. In FIG. 21, the electromagnetic field sensor 1E includes a two-layer printed circuit board, the linear conductor 3A is provided on the first layer, the conductor plate 2 is provided on the second layer, and the detection circuit 8 is provided on a portion of the second layer from which the conductor plate 2 is removed. The input port of the detection circuit 8 is electrically connected to the via 5b by the wire 8b.

The conductor plate 2 and the linear conductor 3A form the loop plane 21 surrounded by the shortest path starting from one end of the linear conductor 3A connected to the via 5b and returning to the side of the one end of the linear conductor 3A via the linear conductor 3A, the via 5a, and the conductor plate 2, when viewed from the side. The loop plane 21 is orthogonal to the plate face of the conductor plate 2. The electromagnetic field sensor 1E includes a printed circuit board that is thinner and has a smaller number of layers than that of the electromagnetic field sensor 1D illustrated in FIG. 20. Therefore, the entire substrate can be made thinner at low cost without changing the reception sensitivity as compared with the multilayer substrate, and the area of the loop plane can be increased by intentionally increasing the thickness of the dielectric layer, so that the effect of an improvement in the reception sensitivity can be obtained.

The electromagnetic field sensor 1E can be used in a case where the influence of the electromagnetic field from the device under test on the detection circuit 8 is small. For example, in a case where the dimension of the device under test is small, a case where the magnetic flux from the device under test is large, or a case where the dielectric is thick and the distance between the device under test and the detection circuit 8 is large, the influence of the electromagnetic field from the device under test on the detection circuit 8 is small, and the structure of the electromagnetic field sensor 1E can be used. Note that the usage method is not limited to the example described above.

Figure 22:
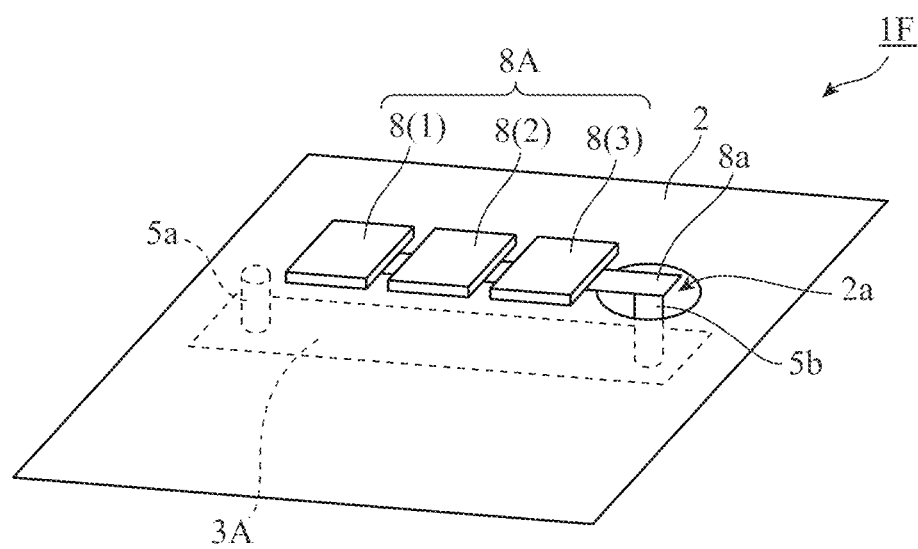
FIG. 22 is a perspective view illustrating a modification B of the electromagnetic field sensor according to the third embodiment.

FIG. 22 is a perspective view illustrating an electromagnetic field sensor 1F, which is a modification B of the electromagnetic field sensor 1D according to the third embodiment. In FIG. 22, the electromagnetic field sensor 1F includes the conductor plate 2, the linear conductor 3A, the via 5a, the via 5b, a detection circuit 8A, and the wire 8a. The detection circuit 8A is a circuit that detects a potential difference between the conductor plate 2 and the linear conductor 3A, and is configured by connecting an IC 8(1), an IC 8(2), and an IC 8(3), which are a plurality of components, in series. The input port of the IC 8(3) in the detection circuit 8A is electrically connected to the via 5b by the wire 8b.

Although not illustrated in FIG. 22, the conductor plate 2 and the linear conductor 3A form the loop plane 21 surrounded by the shortest path starting from one end of the linear conductor 3A connected to the via 5b and returning to the side of the one end of the linear conductor 3A via the linear conductor 3A, the via 5a, and the conductor plate 2, when viewed from the side. The loop plane 21 is orthogonal to the conductor plate 2. As illustrated in FIG. 22, the detection circuit 8A in which the IC 8(1), the IC 8(2), and the IC 8(3) are connected in series is disposed on a plane that is the same as or parallel to the plane including the loop plane 21.

When the electromagnetic field sensor 1F detects an alternating current flowing through the cable 100, the longitudinal direction of the linear conductor 3A is disposed along the longitudinal direction of the cable 100. As a result, the conductor plate 2 with a narrow width can be used. In addition, it is possible to prevent electric field coupling or magnetic field coupling between the wires, and it is also possible to reduce the influence from the outer peripheral portion of the conductor plate where the electromagnetic field is likely to change due to the influence of the skin effect. Furthermore, although the characteristic impedance changes due to the presence of a corner (a corner portion) in the wire connecting the ICs, the change in the characteristic impedance can be reduced by linearly disposing the linear conductor 3A in such a way that the longitudinal direction thereof is along the longitudinal direction of the cable 100.

The IC 8(1), the IC 8(2), and the IC 8(3) in the detection circuit 8A are connected on the plate face of the conductor plate 2 by, for example, soldering. The detection circuit 8A in which the IC 8(1), the IC 8(2), and the IC 8(3) are connected in series is disposed on the plane that is the same as or parallel to the plane including the loop plane 21. Therefore, even in a case where the conductor plate 2 is bent in the direction orthogonal to the longitudinal direction of the linear conductor 3A, the stress of the bending is hardly applied to the IC 8(1), the IC 8(2), and the IC 8(3), and peeling of the solder connection portion of the IC is reduced.

Figure 23:
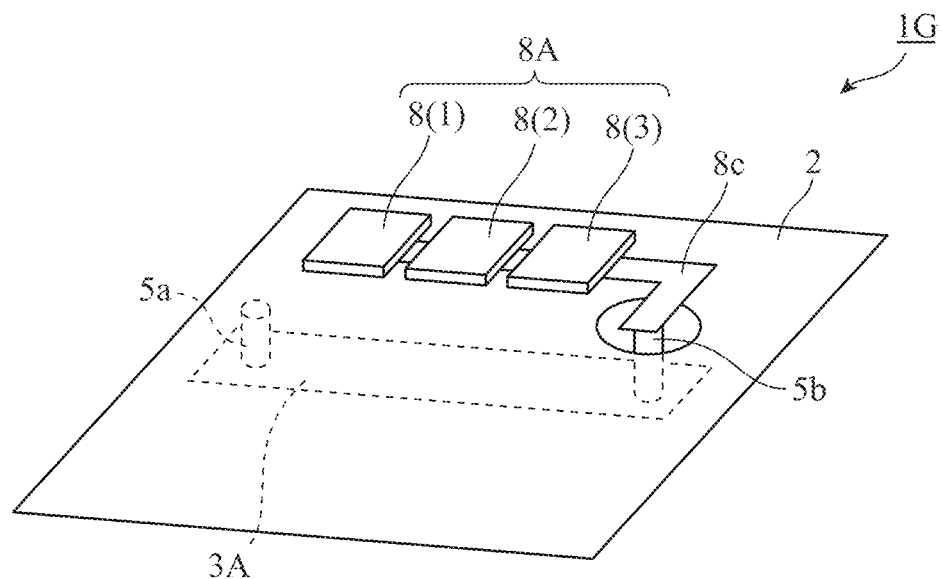
FIG. 23 is a perspective view illustrating a modification C of the electromagnetic field sensor according to the third embodiment.

FIG. 23 is a perspective view illustrating an electromagnetic field sensor 1G, which is a modification C of the electromagnetic field sensor 1D according to the third embodiment. In the electromagnetic field sensor 1F, the wire connecting the components in the detection circuit 8A is disposed on the same plane as the loop plane 21. On the other hand, in the electromagnetic field sensor 1G, the wire connecting the components in the detection circuit 8A is disposed on a plane that is spaced apart and is in parallel with the plane including the loop plane 21.

As the frequency of the magnetic field generated in the device under test increases, a return current easily flows to the portion of the conductor plate 2 facing the linear conductor 3A due to the skin effect. In order not to be affected by the return current, the detection circuit 8A in which the IC 8(1), the IC 8(2), and the IC 8(3) are connected in series is located at a position away from the portion of the conductor plate 2 facing the linear conductor 3A and is disposed on a plane parallel to the plane including the loop plane 21.

For example, the detection circuit 8A is disposed at a position spaced away from the portion of the conductor plate 2 facing the linear conductor 3A by a distance equal to or larger than ten times the width of the linear conductor 3A. In the conductor plate 2, the conductor in the portion where the detection circuit 8A is disposed is removed. As the frequency of the magnetic field generated in the device under test increases, a return current flows only around the portion of the conductor plate 2A facing the linear conductor 3A due to the skin effect. In this case, the interval between the portion of the conductor plate 2 facing the linear conductor 3A and the portion where the detection circuit 8A is disposed may be about three times the width of the linear conductor 3A. Furthermore, in the electromagnetic field sensor 1G, the detection circuit 8A may be disposed by removing a part of the conductor plate 2, as in the electromagnetic field sensor 1E.

As described above, the electromagnetic field sensors 1D to 1G according to the third embodiment include the detection circuit 8 or 8A that detects a potential difference between the conductor plate 2 and the linear conductor 3A. The detection circuit 8 or 8A is disposed on a plate face of the conductor plate 2 opposite to the plate face connected to the linear conductor 3A. The detection circuit 8 or 8A can detect a potential difference between the conductor plate 2 and the linear conductor 3A without using an external measurement device.

In addition, since the detection circuit 8 or 8A is disposed on the plate face of the conductor plate 2 opposite to the plate face connected to the linear conductor 3A, the electromagnetic field sensors 1D to 1G can dispose the linear conductor 3A in such a way that the linear conductor 3A faces the device under test. In the electromagnetic field sensors 1D to 1G disposed as described above, as the magnetic flux generated in the device under test penetrates the loop plane 21, an induced electromotive force is generated in the loop plane 21, and an alternating current generated in the device under test by the induced electromotive force is measured with high sensitivity. As a result, the electromagnetic field sensors 1D to 1G can improve the detection sensitivity of the alternating current.

Furthermore, since the electromagnetic field generated in the device under test is shielded by the conductor plate 2, the electromagnetic field does not make an influence on the detection circuit 8 or 8A provided on the opposite side of the linear conductor 3A to the conductor plate 2, or reduces the influence on the detection circuit 8 or 8A. The detection circuit 8 or 8A desirably includes an operational amplifier that amplifies a signal. Since the operational amplifier amplifies a weak high-frequency signal that is easily attenuated by the coaxial cable, it is easy to detect the signal. In addition, as the signal has a higher frequency, the signal is more likely to be attenuated due to a wire length or a connector. Therefore, in terms of usage, it is preferable to implement the operational amplifier in the immediate vicinity of the electromagnetic field sensor (just behind the via 5b) as illustrated in the third embodiment.

In the electromagnetic field sensors 1F and 1G according to the third embodiment, the detection circuit 8A is configured by connecting the IC 8(1), the IC 8(2), and the IC 8(3) in series. The detection circuit 8A in which the IC 8(1), the IC 8(2), and the IC 8(3) are connected in series is disposed on the plane that is the same as or parallel to the plane including the loop plane 21. Even in a case where the conductor plate 2 is bent in the direction orthogonal to the longitudinal direction of the linear conductor 3A, the stress of the bending applied to the IC 8(1), the IC 8(2), and the IC 8(3) is reduced. As a result, the electromagnetic field sensors 1F and 1G can reduce peeling of the IC from the conductor plate 2.

Fourth Embodiment

Figure 24:
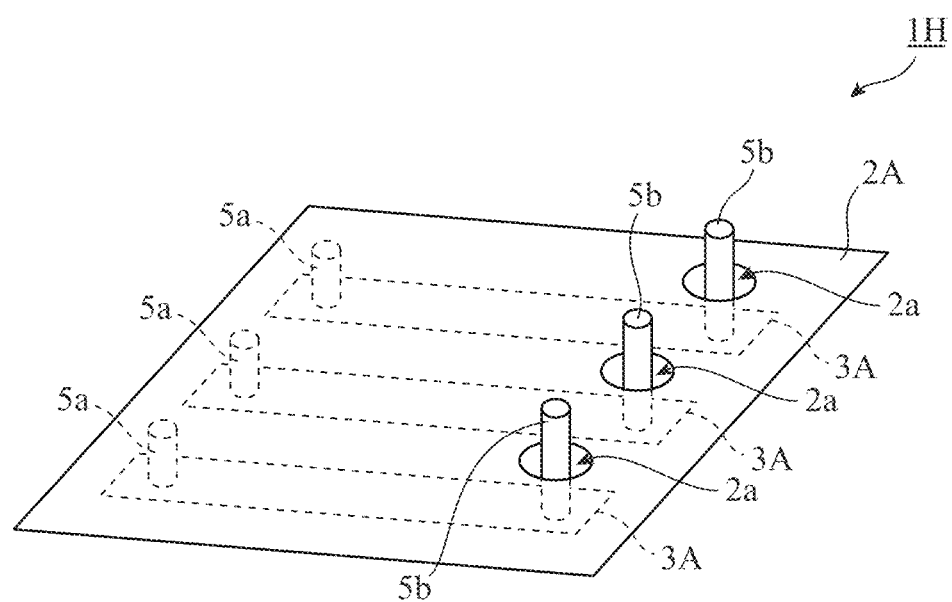
FIG. 24 is a perspective view illustrating an electromagnetic field sensor according to a fourth embodiment.

FIG. 24 is a perspective view illustrating an electromagnetic field sensor 1H according to a fourth embodiment. As illustrated in FIG. 24, the electromagnetic field sensor 1H is, for example, a sensor that detects an alternating current flowing through each of a plurality of cables, and a plurality of linear conductors 3A are provided for one conductor plate 2A. The electromagnetic field sensor 1H includes the conductor plate 2A, the plurality of linear conductors 3A, a plurality of vias 5a, and a plurality of vias 5b. The via 5a is a first columnar conductor that electrically connects the conductor plate A and one open end of the linear conductor 3A. The via 5b is a second columnar conductor that is electrically connected to the other open end of the linear conductor 3A and projects to the side opposite to the linear conductor 3A through the through-hole 2a provided in the conductor plate 2A.

The plurality of linear conductors 3A are arranged on the conductor plate 2A side by side in one direction as illustrated in FIG. 24. The conductor plate 2A and each of the linear conductors 3A form a loop plane surrounded by the shortest path starting from one open end of the linear conductor 3A and returning to the side of the one open end of the linear conductor 3A via the linear conductor 3A, the via 5a, and the conductor plate 2A, when viewed from the side. The loop plane is orthogonal to the plate face of the conductor plate 2A. The via 5b is provided at one open end of the linear conductor 3A. The electromagnetic field sensor 1H is disposed in such a way that the longitudinal direction of each of the linear conductors 3A and the direction in which a current flows in a device under test (DUT) are the same.

For example, in a case where a cable obtained by combining four pairs of differential lines into one line is a device under test (DUT), the linear conductors 3A arranged corresponding to the first pair of differential lines detects an electromagnetic field generated from the first pair of differential lines, and similarly, the linear conductors 3A arranged corresponding to each of the second to fourth pairs of differential lines detects an electromagnetic field generated from each of the second to fourth pairs of differential lines. As a result, the electromagnetic field sensor 1H can detect which value of the alternating current is flowing in which pair of differential lines. In addition, by equalizing the electrical performance (the impedance, electrical length, or the like) of a connector and a coaxial cable attached to each linear conductor, connecting a multi-port oscilloscope, and observing the amplitude and the time difference, it is found that the larger the amplitude and the larger the time difference, the closer the position is, and it is possible to specify the position of the source of signal generation. Furthermore, the directions of the individual linear conductors do not have to be the same direction, and may be changed in accordance with the device under test and the application.

The electromagnetic field sensor 1H may include an OR circuit into which a potential difference between the conductor plate 2A and each linear conductor 3A is entered. For example, in a case where the cable obtained by combining four pairs of differential lines into one line is a device under test (DUT), the OR circuit calculates the OR signal of detection signals from all the pairs of differential lines, and determines whether or not the value of the current flowing through any pair of differential lines deviates from a target value on the basis of the calculated value of the OR signal. Although it is not possible to specify which pair of differential lines in the cable has a current value deviating from the target value, it is possible to determine the state of the cable without using an expensive detection circuit. For the OR circuit, an operational amplifier may be used, or a diode and a resistor may be used. An operational amplifier for amplifying a signal may be inserted between the linear conductor 3A and the OR circuit.

Figure 25:
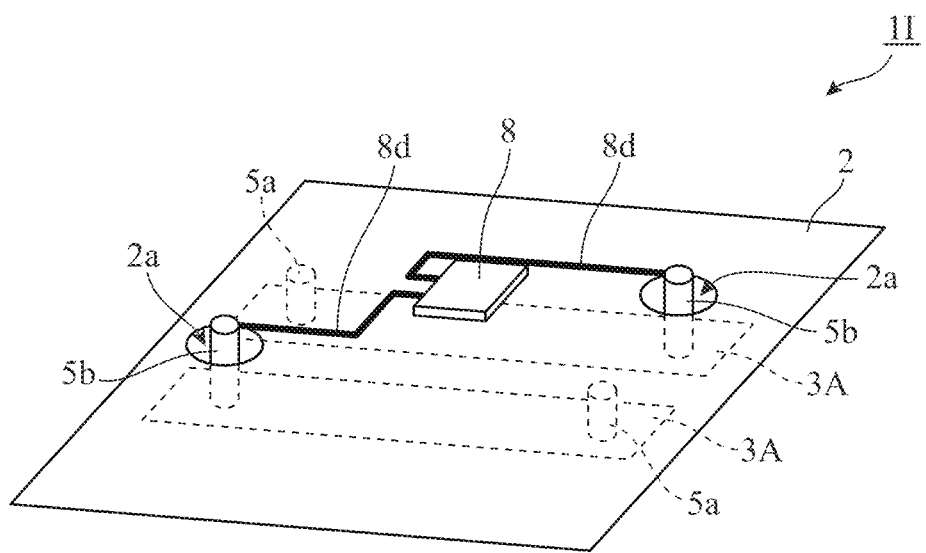
FIG. 25 is a perspective view illustrating a modification A of the electromagnetic field sensor according to the fourth embodiment.

FIG. 25 is a perspective view illustrating an electromagnetic field sensor 1I, which is a modification A of the electromagnetic field sensor 1H. The electromagnetic field sensor 1I includes a plurality of linear conductors 3A for one conductor plate 2, and also includes the vias 5a and 5b provided for each linear conductor 3A, the detection circuit 8, and a wire 8d. The plurality of linear conductors 3A are arranged so that magnetic fluxes penetrating respective loop planes are in the same direction and ends thereof are alternately arranged with respect to the conductor plate 2. For example, the electromagnetic field sensor 1I illustrated in FIG. 25 includes two linear conductors 3A, and in one linear conductor 3A and the other linear conductor 3A, ends connected to the vias 5a and ends connected to the vias 5b are in alternate directions.

The vias 5b connected to the individual linear conductors 3A are connected to the input port of the detection circuit 8 by the wires 8d. In the one linear conductor 3A and the other linear conductor 3A, the ends connected to the individual vias 5b are opposite to each other with respect to the conductor plate 2, and the voltage between the one linear conductor 3A and the conductor plate 2 is opposite in phase to the voltage between the other linear conductor 3A and the conductor plate 2. The detection circuit 8 differentially receives a potential difference therebetween, so that it is possible to detect twice the voltage. For differential input, a differential operational amplifier or a differential receiver can be used. In addition, in order to perform differential input using an oscilloscope, each signal is measured in a single-end manner, and a desired signal is obtained by subtracting the measured value.

Figure 26:
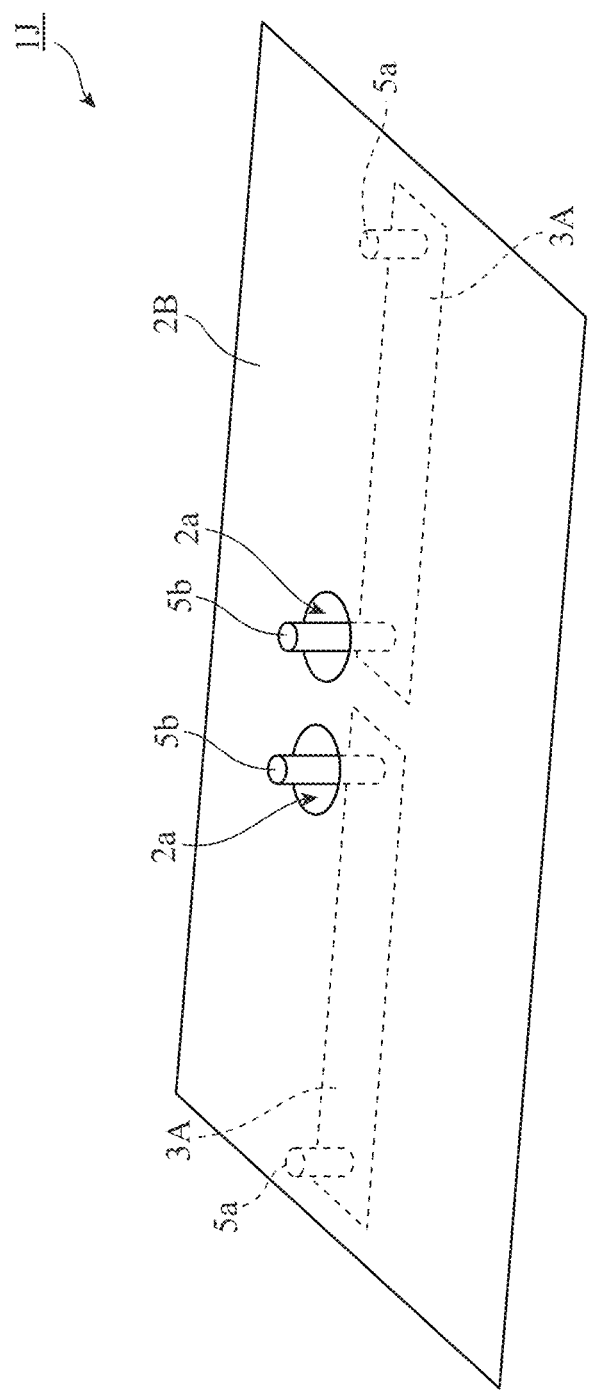
FIG. 26 is a perspective view illustrating a modification B of the electromagnetic field sensor according to the fourth embodiment.

FIG. 26 is a perspective view illustrating an electromagnetic field sensor 1J, which is a modification B of the electromagnetic field sensor 1H. The electromagnetic field sensor 1J includes a plurality of linear conductors 3A for one conductor plate 2B, and also includes the vias 5a and 5b provided for each linear conductor 3A. For example, the electromagnetic field sensor 1I illustrated in FIG. 26 includes two linear conductors 3A, and these linear conductors are arranged in such a way that an end of one linear conductor 3A connected to the via 5b and an end of the other linear conductor 3A connected to the via 5b face each other. That is, the ends of the two linear conductors 3A are alternately arranged along the longitudinal direction of the conductor plate 2B. Since the voltages between the linear conductor 3A and the conductor plate 2B are opposite in phase, the detection circuit 8 can detect twice the voltage by differentially inputting the potential difference therebetween.

As described above, in the electromagnetic field sensors 1H to 1J according to the fourth embodiment, the plurality of linear conductors 3A are arranged in such a way that the magnetic fluxes penetrating the loop plane are in the same direction and the ends thereof are alternately arranged with respect to the conductor plate. The detection circuit 8 detects a potential difference between each linear conductor 3A and the conductor plate as a differential signal. As a result, the electromagnetic field sensors 1H to 1J can detect a signal in which the potential difference between each linear conductor 3A and the conductor plate is amplified as a detection target. Furthermore, in each electromagnetic field sensor, the directions of the linear conductors are not necessarily the same direction, and may be changed in accordance with the device under test or the application.

Fifth Embodiment

Figure 27:
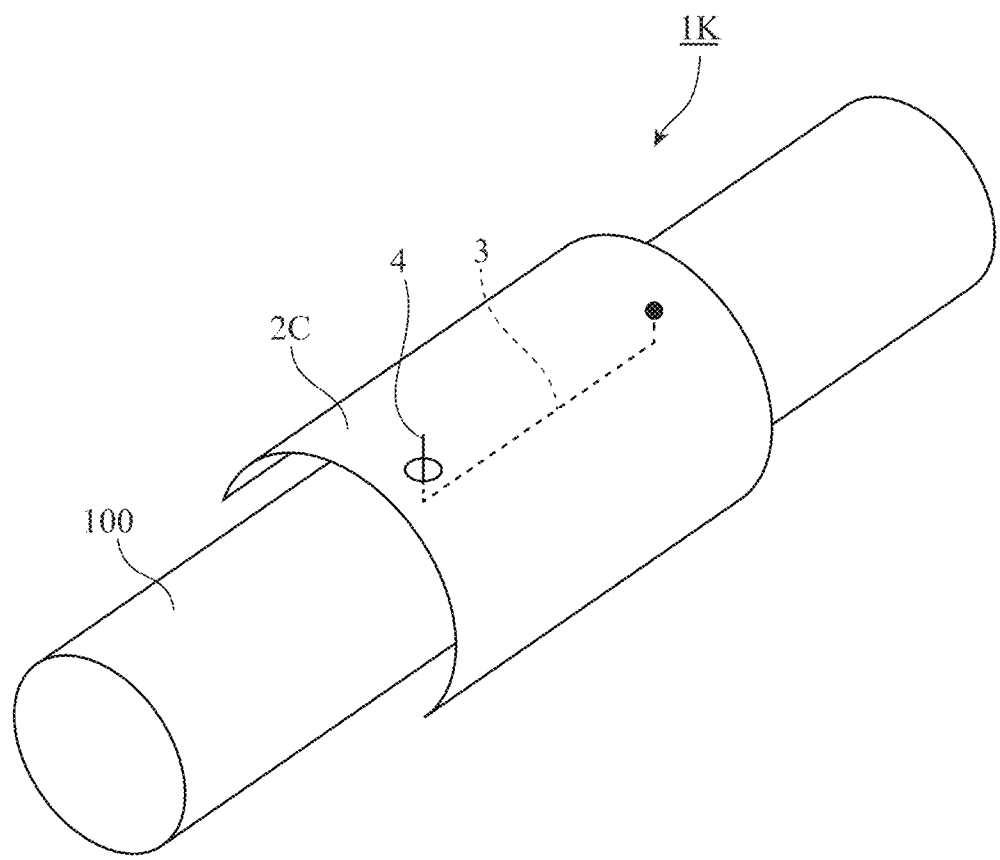
FIG. 27 is a perspective view illustrating an electromagnetic field sensor according to a fifth embodiment and a cable.

FIG. 27 is a perspective view illustrating an electromagnetic field sensor 1K according to a fifth embodiment and the cable 100. In FIG. 27, a conductor plate 2C and the linear conductor 3 in the electromagnetic field sensor 1K include a flexible substrate (FPC). The flexible substrate is, for example, a substrate using a polyamide resin. In the electromagnetic field sensor 1K, the flexible substrate functions as the dielectric 6, and the conductor plate 2C and the linear conductor 3 are configured by patterning a conductor film on the flexible substrate. In addition, the conductor plate 2C and the linear conductor 3 in the electromagnetic field sensor 1K may be thin films formed on a thin film of the dielectric 6.

The electromagnetic field sensor 1K is disposed in such a way that, with respect to the cable 100 as a device under test (DUT), the magnetic flux generated from the cable 100 is parallel to the conductor plate 2C. As a result, since the magnetic flux generated from the cable 100 passes through the loop plane 21 formed by the conductor plate 2C and the linear conductor 3, the detection sensitivity of the electromagnetic field sensor 1K is improved.

In the conventional electromagnetic field sensor without any conductor plate, the magnetic flux generated from the cable 100 as described above is an undetectable component. On the other hand, the electromagnetic field sensor 1K can detect the magnetic flux generated from the cable 100 by covering the circumference of the cable 100 with the conductor plate 2C. The conductor plate 2C may be wound around the entire circumference of the cable 100. When the conductor plate 2C is wound around the cable 100, the ends of the conductor plate 2C may overlap each other.

For attaching the electromagnetic field sensor 1K to the device under test, for example, an adhesive paste or a double-sided tape is used. Note that it is desirable to make the paste or double-sided tape as thin and uniform as possible, and it is desirable to use the paste or double-sided tape with a relative permittivity and a relative permeability close to 1, if possible. Further, the conductor plate 2C may be formed of a shape memory alloy, or the conductor plate 2C may include an attachment structure to the device under test.

Figure 28:
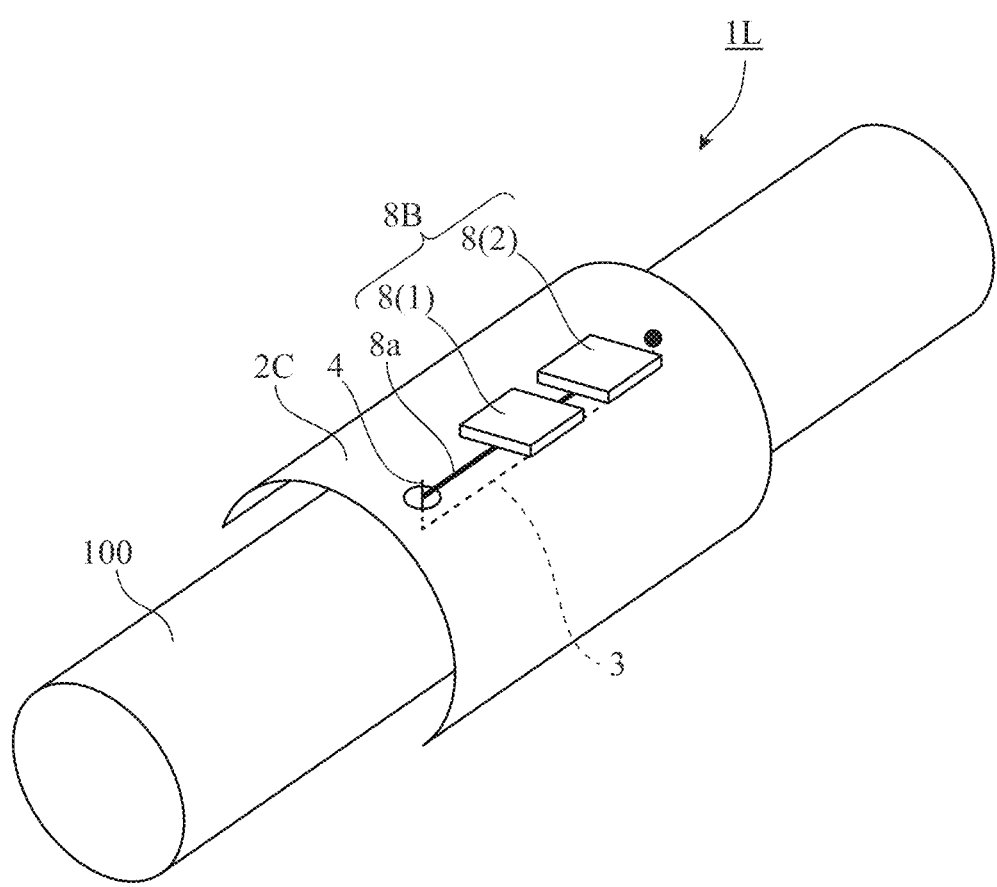
FIG. 28 is a perspective view illustrating a modification A of the electromagnetic field sensor according to the fifth embodiment and the cable.

FIG. 28 is a perspective view illustrating an electromagnetic field sensor 1L, which is a modification A of the electromagnetic field sensor 1K according to the fifth embodiment, and the cable 100. In FIG. 28, the electromagnetic field sensor 1L includes a detection circuit 8B and the wire 8a in addition to the configuration of the electromagnetic field sensor 1K. The detection circuit 8B is configured by connecting the IC 8(1) and the IC 8(2) in series.

The detection circuit 8B in which the IC 8(1) and the IC 8(2) are connected in series is disposed on a plane that is the same as or parallel to the plane including the loop plane 21. For example, the detection circuit 8B is disposed on the conductor plate 2C along the longitudinal direction of the cable 100, that is, the direction in which a current flows in the device under test. Even if the conductor plate 2C is bent in the direction orthogonal to the longitudinal direction of the cable 100, the stress of the bending is less likely to be applied to the IC 8(1) and the IC 8(2), and the possibility that the solder connection portion of the IC is peeled off and the solder is cracked is reduced.

Among the pins of the IC constituting the detection circuit 8B, the pins connected to the conductor plate 2C or the linear conductor 3 are desirably arranged only in the longitudinal direction of the cable 100. In addition, the size of the IC is desirably small.

As described above, in the electromagnetic field sensors 1K and 1L according to the fifth embodiment, the conductor plate 2C, the linear conductor 3, and the dielectric 6 include a flexible substrate or a thin film. As the cable 100, which is a device under test (DUT), can be covered by the conductor plate 2C, the magnetic flux generated around the cable 100 penetrates the loop plane 21, an induced electromotive force is generated in the loop plane 21, and an alternating current generated in the cable 100 by the induced electromotive force is measured with high sensitivity. As a result, the electromagnetic field sensors 1K and 1L can improve the detection sensitivity of the alternating current.

Sixth Embodiment

Figure 29:
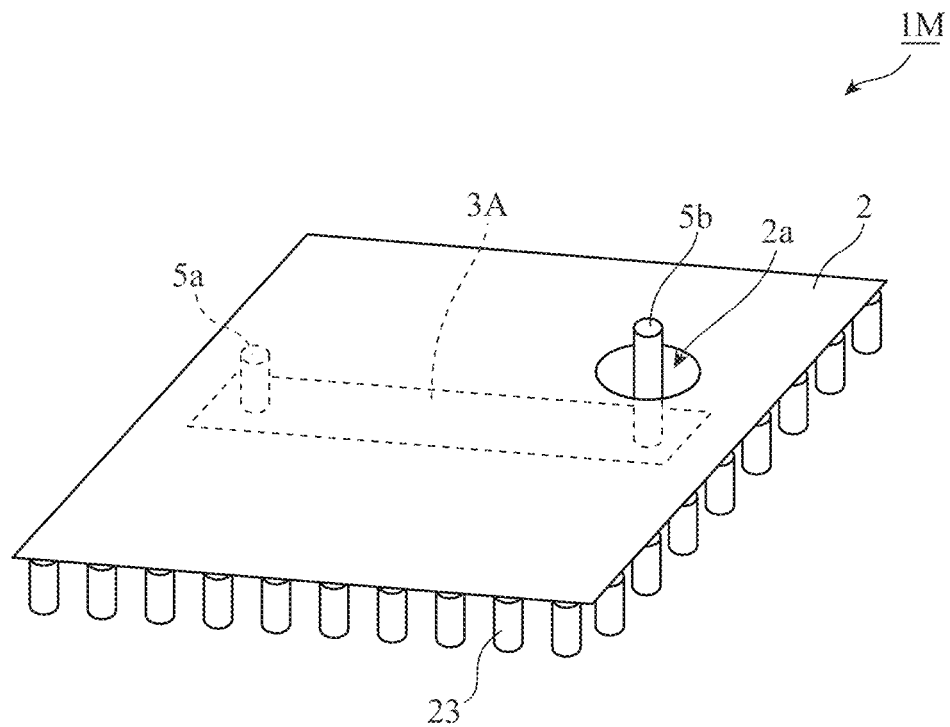
FIG. 29 is a perspective view illustrating an electromagnetic field sensor according to a sixth embodiment.

FIG. 29 is a perspective view illustrating an electromagnetic field sensor 1M according to a sixth embodiment. In FIG. 29, the electromagnetic field sensor 1M has a shield structure including a plurality of GND vias 23 provided around the conductor plate 2. Each of the GND vias 23 is electrically connected to the conductor plate 2 and is a columnar conductor extending from the conductor plate 2 to the bottom face side including the linear conductor 3A. The end on the bottom face side of the GND via 23 is open. In order to bring the conductor plate 2 as close as possible to a device under test (DUT), it is desirable that the GND via 23 is long enough to reach the bottom face or short enough not to reach the bottom face.

As described above, the electromagnetic field sensor 1M according to the sixth embodiment has the shield structure surrounding outer periphery of the conductor plate 2. Since the disturbance noise from the side of the electromagnetic field sensor 1M is removed by the shield structure, the electromagnetic field sensor 1M can detect only a high-frequency signal propagating through a cable, which is a device under test (DUT). In particular, it is possible to remove an electric field component (a line of electric force) generated in an object other than the device under test by the shielding effect of the GND via 23. In addition, the shield may be strengthened by surrounding the conductor plate 2 with the GND vias 23 twice or more times and filling gaps between the GND vias 23.

Seventh Embodiment

Figure 30:
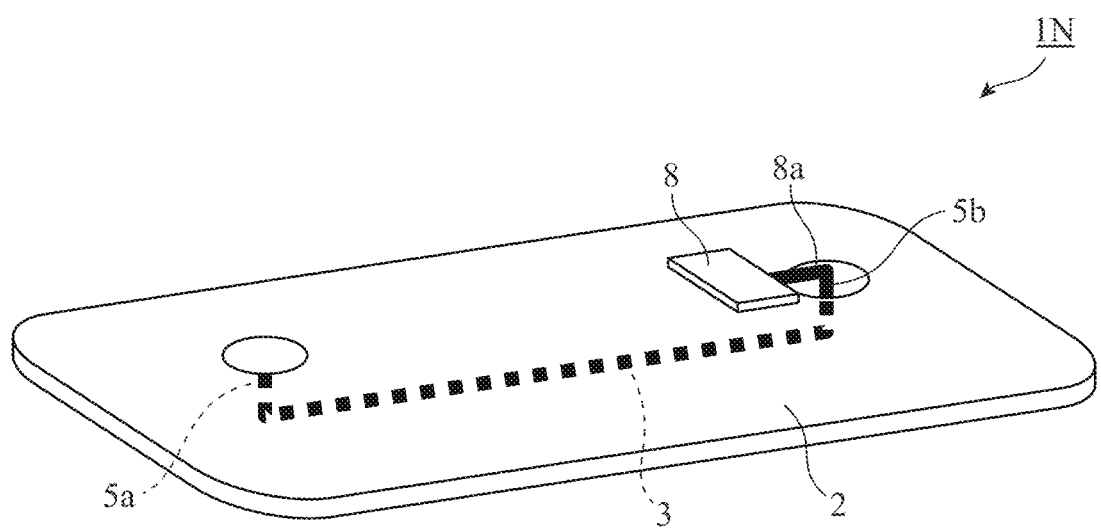
FIG. 30 is a perspective view illustrating an electromagnetic field sensor according to a seventh embodiment.

FIG. 30 is a perspective view illustrating an electromagnetic field sensor 1N according to a seventh embodiment. In FIG. 30, the electromagnetic field sensor 1N is housed in a card that performs non-contact communication, and includes the conductor plate 2 formed on one face of the card, the linear conductor 3 formed inside the card, the via 5a, the via 5b, the detection circuit 8, and the wire 8a. The linear conductor 3 is disposed in parallel with the conductor plate 2. The via 5a is a first columnar conductor that electrically connects the conductor plate 2 and one open end of the linear conductor 3. The via 5b is a second columnar conductor that is electrically connected to the other open end of the linear conductor 3 and projects to the side opposite to the linear conductor 3 through the through-hole 2a provided in the conductor plate 2.

The conductor plate 2 and the linear conductor 3 form a loop plane surrounded by the shortest path starting from one open end of the linear conductor 3 and returning to the side of the one open end of the linear conductor 3 via the linear conductor 3, the via 5a, and the conductor plate 2, when viewed from the side. The loop plane is orthogonal to the plate face of the conductor plate 2. The via 5b is provided at one open end of the linear conductor 3A. The detection circuit 8 is a circuit that is provided on the plate face of the conductor plate 2 opposite to the linear conductor 3 and detects a potential difference between the conductor plate 2 and the linear conductor 3. The input port of the detection circuit 8 is electrically connected to the via 5b by the wire 8a. The detection circuit 8 is, for example, an IC tag of a card. The electromagnetic field sensor 1N can be used in a card system that performs non-contact communication.

As described above, the electromagnetic field sensor 1N according to the seventh embodiment is housed in a card including the detection circuit 8 that is an IC tag. For example, in a case where a plurality of cards are used in an overlapping manner, a signal may not be able to be detected due to interference between the cards, and a problem that the plurality of cards respond simultaneously occurs. On the other hand, in the electromagnetic field sensor 1N, the conductor plate 2 prevents erroneous reading of the card on the side opposite to the linear conductor 3. As a result, it is possible to provide a card system that does not make an influence on reading and writing of a card even when there is an object that causes electromagnetic wave interference, such as a magnetic body or another card, on the back face of the card.

Eighth Embodiment

Figure 31:
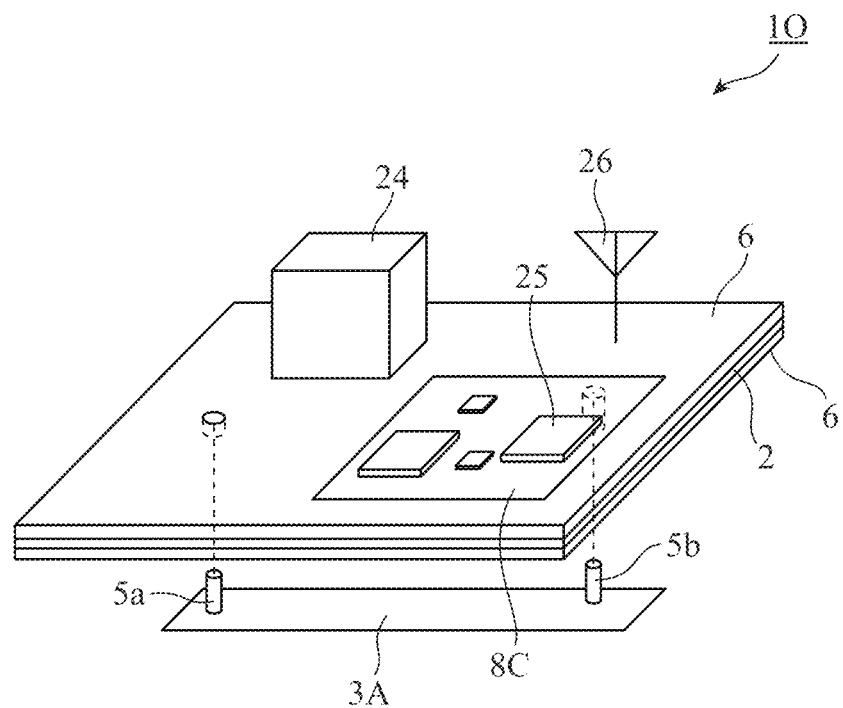
FIG. 31 is a perspective view illustrating an electromagnetic field sensor according to an eighth embodiment.

FIG. 31 is a perspective view illustrating an electromagnetic field sensor 1O according to an eighth embodiment. In FIG. 31, the electromagnetic field sensor 1O includes the conductor plate 2, the linear conductor 3A, the via 5a, the via 5b, a detection circuit 8C, a storage battery 24, an E/O converter 25, and a communication device 26. The linear conductor 3A is disposed in parallel with the conductor plate 2. The via 5a is a first columnar conductor that electrically connects the conductor plate 2 and one open end of the linear conductor 3. The via 5b is a second columnar conductor that is electrically connected to the other open end of the linear conductor 3 and projects to the side of the detection circuit 8C through the through-hole 2a provided in the conductor plate 2.

The conductor plate 2 and the linear conductor 3A form a loop plane surrounded by the shortest path starting from one end of the linear conductor 3A connected to the via 5b and returning to the side of the one end of the linear conductor 3A via the linear conductor 3A, the via 5a, and the conductor plate 2, when viewed from the side. The loop plane is orthogonal to the plate face of the conductor plate 2. The electromagnetic field sensor 1O has a structure in which the conductor plate 2 is sandwiched between the dielectrics 6.

The detection circuit 8C detects a potential difference between the conductor plate 2 and the linear conductor 3A. The electric signal indicating the potential difference detected by the detection circuit 8C is stored in a memory provided inside the detection circuit 8C. The detection circuit 8C includes the E/O converter 25 that is driven by power supplied from the storage battery 24. The E/O converter 25 converts the electrical signal indicating the potential difference between the conductor plate 2 and the linear conductor 3A detected by the detection circuit 8C into an optical signal, and transmits the converted optical signal to an external device via an optical fiber. The E/O converter 25 may be a circuit using a light emitting diode or an infrared element.

The communication device 26 is driven by power supplied from the storage battery 24. The communication device 26 transmits the electrical signal indicating the potential difference between the conductor plate 2 and the linear conductor 3A detected by the detection circuit 8C to an external device by wireless communication. The communication device 26 may be a device that transmits the electric signal indicating the potential difference between the conductor plate 2 and the linear conductor 3A as an ultrasonic signal.

The storage battery 24 is a power storage device that is mounted on the dielectric 6 and supplies power to the detection circuit 8C. The electromagnetic field sensor 1O is not electrically connected to an external device, and drives the detection circuit 8C and the communication device 26 by the power from the storage battery 24. As a result, the electromagnetic field sensor 1O is electrically floating from the potential of the external device.

Note that the power storage device is not limited to the storage battery 24. For example, the power storage device may be a circuit that converts an electromagnetic field detected from the cable 100 into energy and supplies power, or may be a device that supplies power by generating power using a solar panel.

For example, in a case where a power transmission line through which a large current flows is a device under test (DUT), if the electromagnetic field sensor and the external device are electrically connected, there is a concern about a ground fault of the external device or an increase in leakage current when dielectric breakdown occurs. On the other hand, the electromagnetic field sensor 1O exchanges a signal with an external device without electrical conduction by optical communication or wireless communication, and drives the detection circuit 8C and the communication device 26 by the power from the storage battery 24. As a result, even if discharge occurs between the device under test and the electromagnetic field sensor 1O, no current flows through the external device, and thus a ground fault does not occur.

In general, it is difficult to manage short-circuit protection of a large number of electromagnetic field sensors over a long period of time. On the other hand, since the electromagnetic field sensor 1O is electrically floating from the potential of the external device, each electromagnetic field sensor 1O takes measures against a short circuit. Therefore, it is not necessary to manage the short-circuit protection in the electromagnetic field sensor 1O.

For the detection circuit 8C, for example, a Cockcroft-Walton circuit, an A/D converter, and a comparator are used. For example, even a single-stage Cockcroft-Walton circuit can bring an AC signal close to a DC signal. As a result, the IC constituting the detection circuit 8C can detect a high-speed AC signal even if the IC is a low-speed IC with small power consumption. The A/D converter tends to consume more power and information. For this reason, it is suitable to use the detection circuit 8C using the A/D converter for the purpose of monitoring for several hours to several days. In addition, by using the comparator, the detection circuit 8C that detects a voltage exceeding a threshold can be easily configured. The detection circuit 8C that detects the voltage exceeding the threshold is suitable for the purpose of monitoring the voltage in a long period of time of several days to several years. A microcomputer may be used as the communication device 26. The communication device 26 may always transmit the detection result by the electromagnetic field sensor 1O, or may transmit the detection result when there is an abnormality. The detection circuit 8C may include a protection element in such a way that the circuit is not damaged by an abnormal voltage or an abnormal current.

As described above, the electromagnetic field sensor 1O according to the eighth embodiment is not electrically connected to an external device and drives the detection circuit 8C and the communication device 26 by the power from the storage battery 24, so that the electromagnetic field sensor 1O is electrically floating from the potential of the external device. Even if discharge occurs between the device under test and the electromagnetic field sensor 1O, no current flows through the external device, and thus a ground fault does not occur.

Ninth Embodiment

In an electromagnetic field sensor according to a ninth embodiment, in order to improve sensitivity at a specific frequency by intentionally resonating at the specific frequency, the linear conductor 3 is divided into a plurality of portions, and components are arranged in series, in parallel, or in series and parallel between the divided portions of the linear conductor 3, or components are arranged between the linear conductor 3 and the conductor plate 2.

For example, as the component, in addition to a resistor with a low impedance (desirably equal to or less than 100 (A)), a chip inductor, a multilayer ceramic capacitor, and a ferrite bead, an air-core coil, a coil using a magnetic body, or a diode may be used. In particular, regarding a component such as a ferrite bead using a magnetic body, a coil using a magnetic body, or an air-core coil, since the reception sensitivity is doubled in the electric image method, it is possible to obtain an effect other than creating a resonance frequency, depending on the direction of the magnetic flux created by a device under test (DUT) and the direction of wires inside the component.

As the component disposed between the linear conductor 3 and the conductor plate 2, a capacitor or a resistor with a high impedance (desirably equal to or more than 100 k($\Omega$)) can be used. By combining these components, the reception sensitivity of a signal of any frequency can be enhanced without changing the dimensions of the electromagnetic field sensor.

Note that it is possible to combine the embodiments, modify any component of each embodiment, or omit any component of each embodiment.

INDUSTRIAL APPLICABILITY

The electromagnetic field sensor according to the present disclosure can be used, for example, for detection or injection of an alternating current flowing through a cable.

REFERENCE SIGNS LIST 1, 1A to 1O: Electromagnetic field sensor, 2, 2A to 2C: Conductor plate, 2A1: Projection, 2a, 6a, 6b: Through-hole, 3, 3A: Linear conductor, 3a, 3b: End, 4: Signal output terminal, 5, 5a to 5c: Via, 6: Dielectric, 7: Connector, 8, 8A to 8C: Detection circuit, 8a, 8b, 8d: Wire, 21: Loop plane, 22: Coaxial cable, 23: GND via, 24: Storage battery, 25: E/O converter, 26: Communication device, 100: Cable, 200: Electromagnetic field sensor, 201: Linear conductor, 202, 203: Terminal, 204: Connector, 205: Loop plane, 206: Coaxial cable

The invention claimed is:

1. An electromagnetic field sensor comprising:
a conductor plate; and
a linear conductor arranged in parallel to a first face of the conductor plate, the linear conductor including a first end that is curved in a direction perpendicular to the conductor plate and that electrically connects to the first face of the conductor plate without an electrical circuit component, and a second end provided with a signal output terminal, the linear conductor electrically connecting the conductor plate and the signal output terminal, wherein
the electromagnetic field sensor includes a loop plane that is formed by the conductor plate and the linear conductor and includes only a plane orthogonal to the conductor plate when viewed from a side.

2. The electromagnetic field sensor according to claim 1, wherein
a device under test for electromagnetic field is a conductor that generates a magnetic flux in one direction,
the linear conductor is aligned parallel to an electrical current in the device under test so that the magnetic flux generated by the device under test penetrates the loop plane.

3. The electromagnetic field sensor according to claim 1, further comprising:
a columnar conductor to pass through a through-hole provided in the conductor plate, wherein
the second columnar conductor is connected to the linear conductor, projects from the conductor plate through the through-hole and the second through-hole, and is connected to the signal output terminal.

4. The electromagnetic field sensor according to claim 3, further comprising:
a detection circuit to detect a potential difference between the conductor plate and the linear conductor, wherein
the detection circuit is disposed on a face of the conductor plate opposite to a plate face connected to the linear conductor.

5. The electromagnetic field sensor according to claim 4, wherein
the detection circuit includes of a plurality of components connected in series, and
the detection circuit in which the components are connected in series is disposed on a plane that is same as or parallel to a plane including the loop plane.

6. The electromagnetic field sensor according to claim 1, wherein
a length of the linear conductor is equal to or less than $c/(8 \times fmax \times \sqrt{\varepsilon_r})$,
wherein "fmax" is an upper limit value of a measurement frequency, "c" is a light speed, and "$\varepsilon_r$" is a relative permittivity of the dielectric.

7. The electromagnetic field sensor according to claim 1, wherein
a length of the linear conductor is equal to or larger than $c/(fmax \times \sqrt{\varepsilon_r})$,
wherein "fmax" is an upper limit value of a measurement frequency, "c" is a light speed, and "$\varepsilon_r$" is a relative permittivity of the dielectric.

8. The electromagnetic field sensor according to claim 1, wherein
the conductor plate and the linear conductor include a flexible substrate or a thin film.

9. The electromagnetic field sensor according to claim 4, further comprising:
a power store, wherein
the detection circuit is not electrically connected to an external device, driven by power from the power store, and electrically floating from a potential of the external device.

10. The electromagnetic field sensor according to claim 1, wherein
a plurality of linear conductors is provided for the conductor plate.

11. The electromagnetic field sensor according to claim 10, further comprising:
an OR circuit into which a potential difference between the conductor plate and each of the linear conductors is entered.

12. The electromagnetic field sensor according to claim 10, wherein
in the plurality of linear conductors, magnetic fluxes penetrating the loop plane are the same in direction as each other, and ends thereof are arranged in alternate directions with respect to the conductor plate, and
the electromagnetic field sensor further comprising a detection circuit to detect a potential difference between each of the linear conductors and the conductor plate as a differential signal.

13. The electromagnetic field sensor according to claim 1, further comprising:
  a shield structure to block a disturbance noise, the shield structure including a plurality of columnar conductors each extending from the conductor plate to a bottom plane side including the linear conductor, the plurality of columnar conductors being provided along an outer peripheral portion of the conductor plate to surround the linear conductor.

14. The electromagnetic field sensor according to claim 1, wherein
  the electromagnetic field sensor is housed in a card with an IC tag.

15. The electromagnetic field sensor according to claim 1, wherein
  components are arranged in series, in parallel, or in series and parallel between the conductor plate and the linear conductor or on a part of the linear conductor.

16. The electromagnetic field sensor according to claim 1, wherein a dielectric between the conductor plate and the linear conductor includes any one of a glass epoxy, a paper phenol, or a polymer material.

17. The electromagnetic field sensor according to claim 1, wherein a dielectric between the conductor plate and the linear conductor includes air or a vacuum.

* * * * *